US012583961B2

(12) United States Patent
Baskaran et al.

(10) Patent No.: US 12,583,961 B2
(45) Date of Patent: Mar. 24, 2026

(54) TUNABLE HIGH-CHI DIBLOCK COPOLYMERS CONSISTING OF ALTERNATING COPOLYMER SEGMENTS FOR DIRECTED SELF-ASSEMBLY AND APPLICATION THEREOF

(71) Applicant: Merck Patent GmbH, Darmstadt (DE)

(72) Inventors: Durairaj Baskaran, Bridgewater, NJ (US); Md S. Rahman, Flemington, NJ (US); Sachin Bobade, Somerville, NJ (US); Edward W. Ng, Belle Mead, NJ (US); Victor Monreal, Breinigsville, PA (US); EunJeong Jeong, Gyeonggi-do (KR)

(73) Assignee: Merck Patent GmbH, Darmstadt (DE)

( * ) Notice: Subject to any disclaimer, the term of this patent is extended or adjusted under 35 U.S.C. 154(b) by 485 days.

(21) Appl. No.: 18/253,083

(22) PCT Filed: Dec. 15, 2021

(86) PCT No.: PCT/EP2021/085861

§ 371 (c)(1),
(2) Date: May 16, 2023

(87) PCT Pub. No.: WO2022/129154

PCT Pub. Date: Jun. 23, 2022

(65) Prior Publication Data

US 2024/0002571 A1 Jan. 4, 2024

Related U.S. Application Data

(60) Provisional application No. 63/126,570, filed on Dec. 17, 2020.

(51) Int. Cl.

*C08F 212/08* (2006.01)
*C08F 212/32* (2006.01)

(Continued)

(52) U.S. Cl.

CPC ........ *C08F 297/026* (2013.01); *C08F 212/08* (2013.01); *C08F 212/32* (2013.01); *C09D 153/00* (2013.01); *G03F 7/0002* (2013.01)

(58) Field of Classification Search

None

See application file for complete search history.

(56) References Cited

U.S. PATENT DOCUMENTS

2016/0244557 A1 8/2016 Vora et al.
2017/0145250 A1* 5/2017 Navarro ................ G03F 7/0002

FOREIGN PATENT DOCUMENTS

FR 2582659 A1 * 12/1986 .............. C08L 25/06
JP 2008144006 A * 6/2008

(Continued)

OTHER PUBLICATIONS

Reply to EPO in European Patent Application 21839891.5, Aug. 21, 2023. (Year: 2023).*

(Continued)

*Primary Examiner* — Richard A. Huhn
(74) *Attorney, Agent, or Firm* — EMD Performance Materials Corp.

(57) ABSTRACT

The disclosed subject matter relates to a block polymer comprising structure (1): (A)-(C)-(B), wherein (A) is a first polymer block segment comprising a block segment selected from structure (1a), structure (1b), and a mixture of structures (1a) an (1b), (C) is a spacer moiety comprising structure (1c); and wherein B) is a second polymer block segment comprising repeat units derived from either an alkyl 2-methylenealkanoate, a lactone; a cyclic carbonate, an oxirane, or an oxetane. The disclose matter also pertains to a composition of said block polymer in a spin casting solvent and using this solution in a process of directed self-assembly.

39 Claims, 8 Drawing Sheets

(51) Int. Cl.

| | |
|---|---|
| ***C08F 297/02*** | (2006.01) |
| ***C09D 153/00*** | (2006.01) |
| ***G03F 7/00*** | (2006.01) |

(56) References Cited

FOREIGN PATENT DOCUMENTS

| | | | |
|---|---|---|---|
| JP | 2010-283928 | A | 12/2010 |
| WO | 01/96432 | A1 | 12/2001 |
| WO | 01/96455 | A1 | 12/2001 |
| WO | 2015/189495 | A1 | 12/2015 |
| WO | 2016/088785 | A1 | 6/2016 |
| WO | 2018/066716 | A1 | 4/2018 |
| WO | 2022/129154 | A1 | 6/2022 |

OTHER PUBLICATIONS

Balsamo, V. et al., "Synthesis of Sbc, Sc and BC block copolymers based on polystyrene (S), polybutadiene (B) and a crystallizable poly (ε-caprolactone)(C) block", Macromolecular Chemistry and Physics, vol. 197, No. 3, 1996, pp. 1159-1169.

Bohnert, R. et al., "Liquid-Crystalline side-chain AB block copolymers by direct anionic polymerization of a mesogenic methacrylate", Macromolecular Chemistry and Physics, vol. 195, No. 2, 1994, pp. 689-700.

Chevalier, X. et al., "Improvements of self-assembly properties via homopolymer addition or block-copolymer blends", Alternative Lithographic Technologies VI, Proceeding of SPIE, vol. 9049, 2014, pp. 90490T-1-90490T-13.

George, S. M., "Atomic layer deposition: an overview", Chemical reviews, vol. 110, No. 1, 2010, pp. 111-131.

Hirao, A. et al., "Functionalized polymers with 1,3-dienyl or styryl groups by anionic living polymerization", Polymer Preprints, vol. 41, No. 1, 2000, pp. 151-152.

Kern, W. et al., "Deposition technologies and applications: Introduction and overview", Handbook of Thin Film Deposition Processes and Techniques, 2001, pp. 11-43.

Kos, T. et al., "The use of the DPE radical polymerization method for the synthesis of chromophore-labelled polymers and block copolymers", European Polymer Journal, vol. 41, No. 6, Feb. 22, 2005, pp. 1265-1271.

Mouzali, M. et al., "Functionalization of (styrene-b-isoprene) block copolymers by epichlorohydrin", European Polymer Journal, vol. 25, No. 5, 1989, pp. 491-499.

Nagaki, A. et al., "Synthesis of polystyrenes—poly (alkyl methacrylates) block copolymers via anionic polymerization using an integrated flow microreactor system", Macromolecules, vol. 43, No. 20, Sep. 16, 2010, pp. 8424-8429.

Pang, Y. et al., "Directed Self-Assembly of Styrene-Methyl Acrylate Block Copolymers with Sub-7 nm Features via Thermal Annealing", Macromolecules, vol. 52, No. 8, Apr. 4, 2019, pp. 2987-2994.

International Preliminary Report on Patentability received for PCT Application No. PCT/EP2021/085861, mailing date Jun. 29, 2023, 8 Pages.

International Search Report and Written Opinion received for PCT Application No. PCT/EP2021/085861, mailing date Apr. 14, 2022, 12 Pages.

Wang, W. et al., "Preparation of diblock copolymer PBA-b-PSt by DPE method in emulsion", Journal of Polymer Research, vol. 18, 2011, pp. 1229-1235.

Wang, W. et al., "Synthesis of block copolymer poly (n-butyl acrylate)-b-polystyrene by DPE seeded emulsion polymerization with monodisperse latex particles and morphology of self-assembly film surface", Journal of colloid and interface science, vol. 374, No. 1, Jan. 28, 2012, pp. 54-60.

Wieland, P. C et al., "Synthesis of new graft copolymers by combining the DPE technique and cationic polymerization", Macromolecular rapid communications, vol. 23, No. 14, 2002, pp. 809-813.

Woo, S. et al., "Molecular Tailoring of Poly(styrene-b-methyl methacrylate) Block Copolymer Toward Perpendicularly Oriented Nanodomains with Sub-10 nm Features", ACS Macro Letters, vol. 6, No. 12, Nov. 30, 2017, pp. 1386-1391.

Zhao, M. et al., "Influences for preparation of PMMA-b-P t BA block copolymer mediated by DPE-containing macroinitiator", Journal of Polymer Research, vol. 22, No. 12, Nov. 3, 2015, pp. 1-8.

Zhao, M. et al., "Preparation of PMMA-b-PSt Block Copolymer via Seeded Emulsion Polymerization in the Presence of 1, 1-Diphenylethylene", Macromolecular Reaction Engineering, vol. 8, No. 8, 2014, pp. 555-563.

* cited by examiner

TUNABLE HIGH-CHI DIBLOCK COPOLYMERS CONSISTING OF ALTERNATING COPOLYMER SEGMENTS FOR DIRECTED SELF-ASSEMBLY AND APPLICATION THEREOF

This application is a national stage application, filed under 35 U.S.C. § 371, of International Patent Application No. PCT/EP2021/085861 (filed on 15 Dec. 2021) which claims the benefit of U.S. Provisional Patent Application No. 63/126,570 (filed on 17 Dec. 2020) each of which applications is incorporated herein by reference in their entirety.

FIELD

The disclosed subject matter pertains to a novel block copolymer, compositions comprising a novel block copolymer and processes using the inventive composition for producing perpendicular domains (e.g., lamellae, cylinders etc.) formed by self-assembly (SA) or directed self-assembly (DSA) of the novel block copolymers (BCPs). The processes are useful for fabrication of electronic devices.

BACKGROUND

In conventional lithography approaches, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. Directed self-assembly is a promising approach which has been of interest in overcoming some of the drawbacks of conventional lithography as outlined above.

Specifically, directed self-assembly of block copolymers is a method useful for generating very small patterned features for the manufacture of microelectronic devices in which the critical dimensions (CD) of features usually on the order of nano scale ranging in feature size from 10 nm to 50 nm can be achieved. Achieving feature sizes below 10 nm using conventional approaches for directed self-assembly of block copolymers is challenging. Directed self-assembly methods such as those based on graphoepitaxy and chemical epitaxy of block copolymers are desirable for extending the resolution capabilities of lithographic technology.

These techniques can be employed to either enhance conventional lithographic techniques by enabling the generation of pattern with higher resolution and/or improving CD control for EUV, e-beam, deep UV or immersion lithography. The directed self-assembly block copolymer comprises a block of etch resistant polymeric unit and a block of highly etchable polymeric unit, which when coated, aligned and etched on a substrate give regions of high-resolution patterns.

Known examples of block copolymers suitable for directed self-assembly are ones capable of microphase separation and comprising a block rich in carbon (such as styrene or containing some other element like Si, Ge, and Ti) which is resistant to plasma etch, and a block which is highly plasma etchable or removable, which can provide a high resolution pattern definition. Examples of highly etchable blocks can comprise monomers which are rich in oxygen and which do not contain refractory elements and can form blocks which are highly etchable, such as methyl methacrylate. The plasma etching gases used in the etching process of defining the self-assembly pattern typically are those used in processes to make integrated circuits (IC). In this manner very fine patterns can be created on typical IC substrates compared to conventional lithographic techniques, thus achieving pattern multiplication.

In the graphoepitaxy directed self-assembly method, the block copolymers self-organizes on a substrate that is pre-patterned with conventional lithography (Ultraviolet, Deep UV, and e-beam, Extreme UV (EUV) exposure source) to form topographical features such as a line/space (L/S) or contact hole (CH) pattern. In an example of L/S directed self-assembly array, the block copolymer can form self-aligned lamellar regions with a sub-lithographic pitch in the trenches between sidewalls of pre-pattern, thus enhancing pattern resolution by subdividing the space in the trench between the topographical lines into finer patterns. Similarly, features such as contact holes can be made denser by using graphoepitaxy in which a suitable block copolymer arranges itself by directed self-assembly within an array of pre-patterned holes or pre-patterned posts defined by conventional lithography, thus forming a denser array of regions of etchable and etch resistant domains which when etched give rise to a denser array of contact holes. In addition, block copolymers can form a single and smaller etchable domain at the center of prepattern hole with proper dimension and provide potential shrink and rectification of the hole in prepattern. Consequently, graphoepitaxy has the potential to offer both pattern rectification and pattern multiplication.

In chemoepitaxy DSA methods, the self-assembly of the block copolymer occurs on a surface that has regions of differing chemical affinity but no or very slight topography to guide the self-assembly process. For example, the chemical prepattern could be fabricated using lithography (UV, Deep UV, e-beam, EUV) and nanofabrication process to create surfaces of different chemical affinity in a line and space (L/S) pattern. These areas may present little to no topographical difference but do present a surface chemical pattern to direct self-assembly of block copolymer domains. This technique allows precise placement of these block copolymer domains of higher spatial frequency than the spatial frequency of the prepattern. The aligned block copolymer domains can be subsequently pattern transferred into an underlying substrate after plasma or wet etch processing. In addition, Chemical epitaxy has the advantage that the block copolymer self-assembly can rectify variations in the surface chemistry, dimensions, and roughness of the underlying chemical pattern to yield improved line-edge roughness and CD control in the final self-assembled block copolymer domain pattern. Other types of patterns such as contact holes (CH) arrays could also be generated or rectified using chemoepitaxy.

The ability of a BCP to phase separate depends on the Flory Huggins interaction parameter ($\chi$). PS-b-PMMA (poly (styrene-block-methyl methacrylate) is the most promising candidate for directed self-assembly (DSA) applications. However, the minimum half-pitch of PS-b-PMMA is limited to about 10 nm because of lower interaction chi parameter ($\chi$) between PS and PMMA. To enable further feature miniaturization, a block copolymer with a larger interaction parameter between two blocks (higher chi) is highly desirable.

For lithography applications, orientation of the block copolymer domains perpendicular to the substrate is desirable. For a conventional block copolymer such as PS-b-PMMA in which both blocks have similar surface energies at the BCP-air interface, this can be achieved by coating and thermally annealing the block copolymer on a layer of non-preferential or neutral material that is grafted or cross-linked at the polymer-substrate interface. Due to larger difference in the interaction parameter between the domains of higher-$\chi$block copolymers, it is important to control both BCP-air and BCP-substrate interactions. Many orientation control strategies for generating perpendicularly oriented BCP domains have been implemented with higher-$\chi$BCPs. For example, solvent vapor annealing has been used for orientation control of polystyrene-b-polyethylene oxide (PS-b-PEO), polystyrene-b-polydimethylsiloxane (PS-b-PDMS), polystyrene-b-poly(2-vinyl pyridine) (PS-b-P2VP), polylactide-b-poly(trimethylsilylstyrene) PLA-b-PTMSS and PDMS-b-PHOST. Introducing a solvent vapor chamber and kinetics of solvent vapor annealing may complicate DSA processing. Alternatively, the combination of neutral underlayers and topcoat materials has been applied to PS-b-P2VP, PS-b-PTMSS and PLA-b-PTMSS to achieve perpendicular orientation of the polymer domains. However, the additional topcoat materials may increase the process cost and complexity. Directing self-assembly (DSA) of polystyrene-b-polymethylmethacrylate (PS-b-PMMA) block copolymer is widely used as next generation lithography patterning. Microphase separation of diblock copolymer is used for feature size control in lithography. The widely used diblock copolymer such as PS-b-PMMA having chi parameter of ~0.04 can produce feature sizes from 23 nm and above in thin film morphology with appropriate underlayer or prepattern for DSA application. However, if one wants to reduce the feature sizes lower than 23 nm, higher-chi block copolymer is required as the critical molecular weight of phase separation can be reduced much lower and can have small feature sizes of sub 20 nm. The difficulty in orientating block domains perpendicular to the substrate is huge for high-chi block copolymer. It requires developing new underlayers and top-coat for assembling high-chi block copolymer.

SUMMARY

Thus, there is a need for novel tunable high-chi block copolymer whose chi ($\chi$) parameters ($\chi$>0.04) is subtly altered so that it can orient in conventional underlayers for PS-b-PMMA DSA without a top-coat. To fulfill this need we have developed a series of new high-chi block copolymer and blends thereof whose chi parameter can be tuned depending on the comonomer concentration that can assemble on the underlayers that works for current 1st generation PS-b-PMMA without the need for specially underlayers specially tuned for high chi block block-copolymers. This is important as the industry does not need to change several parameters and apply this new high-chi system for DSA application. As a non-limiting example of these new high Chi block copolymers they are ones in which the non-polar high etch resistant polystyrene like block segment in PS-b-PMMA was modified using alternating copolymerization with diphenylethylene in the diblock copolymer synthesis prior to reaction with MMA or other monomers which can form the polar etchable block forming a series of new tunable high-chi diblock copolymer that can microphase separate into domain sizes much smaller than 20 nm. Interestingly, these new tunable high-chi block copolymers can be used directly for DSA on existing neutral underlayers and pinning materials used for non-high chi block copolymers such as PS-b-PMMA. This was done, for instance, as a non-limiting example, by copolymerizing diphenylethylene (DPE) derivatives of this monomers forming under anionic polymerization only an alternating copolymer segment in the block copolymer. This new non-polar copolymer segment, PS-Alt-DPE copolymer, was placed either at the beginning or at the end of the non-polar living chain which were then used to grow polar block such as PMMA or other derivatives in living anionic polymerization. The additional advantages of DPE and its derivatives is that these increase the $T_g$, etch resistivity and to improve pattern transfer when this copolymer segment is incorporated into a diblock copolymer. Consequently, in addition to tuning the chi parameter, and flexibility of compatible underlayers, etch selectivity or resistivity can be improved via increasing the polymer's $T_g$, Ohnishi Parameter or Ring Parameter by increasing the DPE or DPE derivative content. Applications that require tuning of etch resistance require high $T_g$ styrenic polymers that were obtained by alternative copolymerization with sterically hindered DPE type monomers. The polystyrenic copolymer segment described in this invention provides higher $T_g$ depending of the comonomer composition and increased etch resistance through an increase of the Ring Parameter, R to exhibit modulation in solubility as well as etch resistivity. As the synthesis is accomplished via living anionic copolymerization, the described diblock copolymer exhibits a narrow molecular weight distribution (Mw/Mn<1.20). With PS-Alt-DPE copolymer segment's sequence control in the anionic polymerization, the diblock copolymer is evenly distributed high-chi monomer unites at the interface of the segregated block copolymer and works with normal underlayers that are suitable for PS-b-PMMA DSA.

As a summary, this invention pertains to a block polymer comprising structure (1), compositions comprising this block copolymer, and a process of using these compositions in directed self-assembly.

(A)-(C)-(B) (1)

In structure (1), (A) is a polymer block segment comprising a copolymer block segment selected from structure (1a), structure (1b), and a mixture of structures (1a) and (1b), wherein Ar, $Ar_a$, $Ar_b$, and $Ar_e$ are independently unsubstituted aryl moieties or aryl moieties with at least one substituent selected from the group consisting of a C-1 to C-8 alkyl, and a moiety comprising a C-5 to C-18 perfluoroalkyl with at least one ether linkage, x, x1, x2 and x3 and x4 are independently the number of repeat units.

Structures (1a1), (1a2) and (1a3), which are present in structure (1a), structure (1b) or a mixture of structures (1a) and (1b), are present in amounts such that the mole % of structure (1a1) ranges from about 3 mole % to about 40 mole %, as measured against to sum of structures (1a1), (1a2) and (1a3). Further, the $M_w$ of (A) ranges from about 5,000 to about 100,000 g/mole.

(1a)

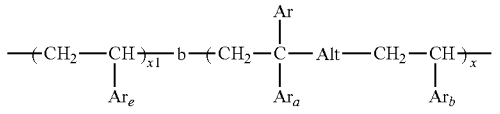

(1b)

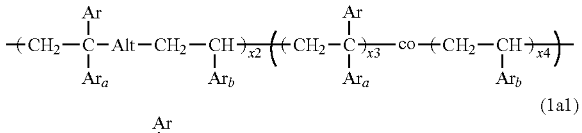

(1a1)

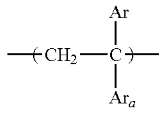

(1a2)

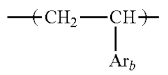

(1a3)

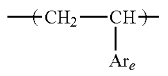

In Structure (1), (C) is a spacer moiety comprising structure (1c), wherein $Ar_c$ and $Ar_d$ are independently unsubstituted aryl moieties or aryl moieties with at least one substituent selected from the group consisting of a C-1 to C-8 alkyl, and a moiety comprising a C-5 to C-18 perfluoroalkyl with at least one ether linkage.

(1c)

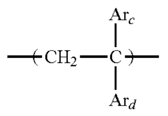

In Structure (1), (B) is a second polymer block segment comprising repeat units derived from an alkyl 2-methylene-alkanoate (alkyl-O—(C═O)—C(alkyl)=$CH_2$), a lactone; a cyclic carbonate, an oxirane, or an oxetane, wherein the Mw of (B) ranges from about 5,000 g/mol to about 100,000 g/mol; and said block copolymer comprising structure (1) has a $M_w$ ranging from about 10,000 g/mol to about 200,000 g/mol and has a polydispersity of 1.00 to about 1.20.

BRIEF DESCRIPTION OF THE FIGURES

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter.

DETAILED DESCRIPTION

Figure 1:
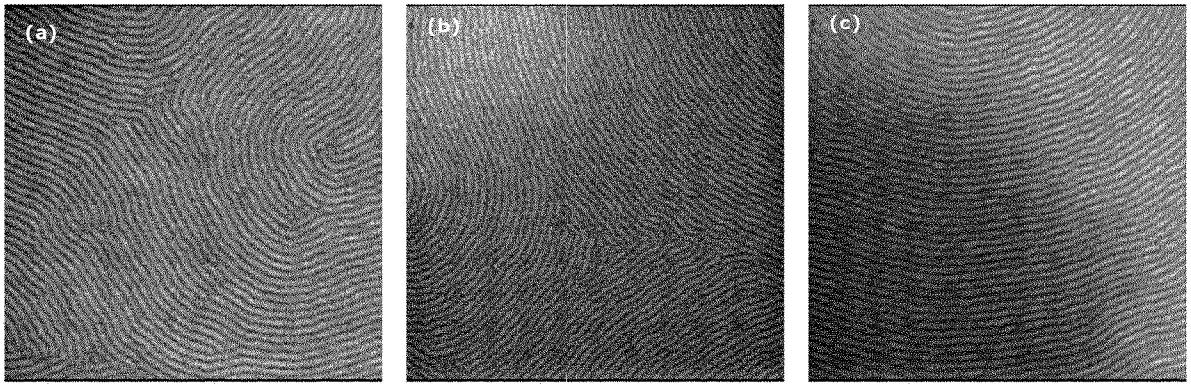
FIG. 1: FP of PS-b-P(S-Alt-DPE)-b-PMMA with 10, 20 and 30 mol % of DPE on styrene and MMA copolymer brush underlayer (Neutral Underlayer Synthesis Example 1). 1FOV SEM images, Process conditions: Neutral Underlayer Synthesis Example 1: 230° C./4 hours ($N_2$); EBR 2 min, spin dry, 110° C./1 min, FT=30 nm. (a) DPE 10 mol %, $L_0$=21.9 nm, (b) DPE 20 mol %, $L_0$=18.8 nm and (c) DPE 30 mol %, $L_0$=21.27 nm.

It is to be understood that both the foregoing general description and the following detailed description are illustrative and explanatory and are not restrictive of the subject matter as claimed. In this application, the use of the singular includes the plural, the word “a” or “an” means “at least one,” and the use of “or” means “and/or,” unless specifically stated otherwise. Furthermore, the use of the term “including,” as well as other forms such as “includes” and “included,” is not limiting. Also, terms such as “element” or “component” encompass both elements and components comprising one unit and elements or components that comprise more than one unit, unless specifically stated otherwise. As used herein, the conjunction “and” is intended to be inclusive and the conjunction “or” is not intended to be exclusive unless otherwise indicated. For example, the phrase “or, alternatively” is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature references and similar materials defines a term in a manner that contradicts the definition of that term in this application, this application controls.

Unless otherwise indicated, "alkyl" refers to hydrocarbon groups which can be linear, branched (e.g., methyl, ethyl, propyl, isopropyl, tert-butyl and the like), cyclic (e.g., cyclohexyl, cyclopropyl, cyclopentyl and the like) or multicyclic (e.g., norbornyl, adamantly and the like). These alkyl moieties may be substituted or unsubstituted as described below. The term "alkyl" refers to such moieties with C-1 to C-8 carbons. It is understood that for structural reasons linear alkyls start with C-1, while branched alkyls and cyclic alkyls start with C-3 and multicyclic alkyls start with C-5. Moreover, it is further understood that moieties derived from alkyls described below, such as alkyloxy and perfluoroalkyl, have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbons for a given type of alkyl group still apply.

Alkyloxy (a.k.a. Alkoxy) refers to an alkyl group on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br or I which is linked by one bond to an organic moiety.

The term alkyl 2-methylenealkanoate (alkyl-O—(C═O)—C(alkyl)═$CH_2$), refers to alkyl esters of a 2-methylenealkanoate, wherein said 2-methylenealkanoate may incorporate up to 11 carbon atoms, and said alkyl in alkyl 2-methylenealkanoate may incorporate up to 8 carbon atoms, selected from methyl, linear alkyls, branched alkyls and cyclic alkyls. The following structures give a general structure for such alkyl 2-methylenealkanoate, where $Ralk_a$ and $Ralk_b$ independently are selected from C-1 to C-8 alkyl groups and show non-limiting examples of alkyl 2-methylenealkanoates falling within this scope.

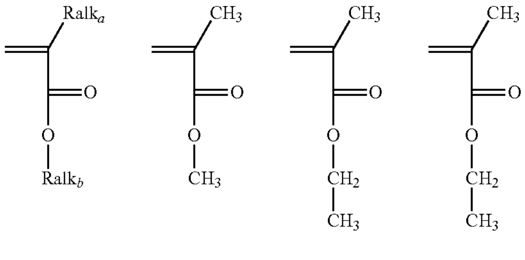

-continued

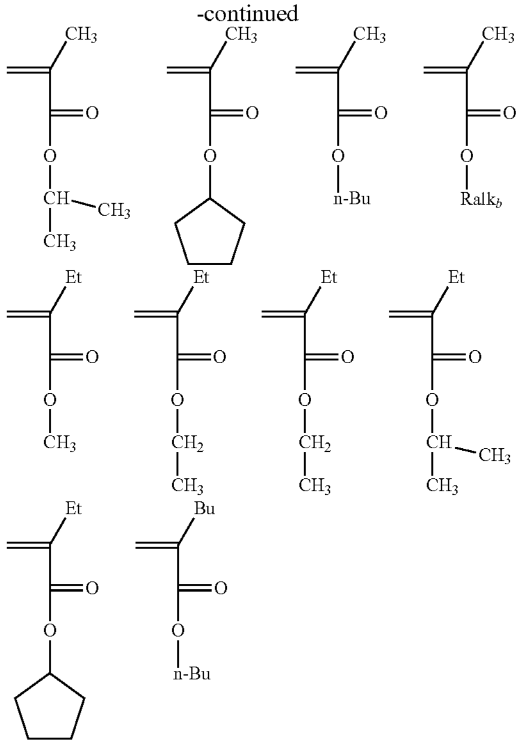

As used herein the term lactone encompasses both mono-lactones (e.g., caprolactone) and di-lactones (e.g., lactide).

Haloalkyl refers to a linear, cyclic or branched saturated alkyl group such as defined above in which at least one of the hydrogens has been replaced by a halide selected from the group of F, Cl, Br, I or mixture of these if more than one halo moiety is present. Fluoroalkyls are a specific subgroup of these moieties.

Perfluoroalkyl refers to a linear, cyclic or branched saturated alkyl group as defined above in which the hydrogens have all been replaced by fluorine (e.g., trifluoromethyl, pefluoroethyl, perfluoroisopropyl, perfluorocyclohexyl and the like).

Perfluoroalkyloxy or perfluoroalkoxy refers to a fluoroalkyl group, as defined above, on which is attached through an oxy (—O—) moiety and are completed fluorinated (a.k.a. perfluorinated).

The term "a moiety comprising a C-5 to C-18 perfluoroalkyl with least one ether linkage," refers to a perfluoroether moiety in which at least one ether functional group is present between two perfluorinated carbons in a moiety comprising 5 to 18 perfluorinated carbons present as either as $CF_3$, $CF_2$, CF, or mixtures of these which can either be free of non-fluorinated carbons or contain, as the attachment point, a C-1 to C-4 alkylene moiety (e.g. —$CH_2$—, —$CH_2$—$CH_2$— and —$CH_2$—$CH_2$—$CH_2$—, —$CH_2$—$CH_2$—$CH_2$—$CH_2$—). Specific, non-limiting examples of "a moiety comprising a C-5 to C-18 perfluoroalkyl with at least one ether linkage, are shown in structures (If) to (If19).

(If)

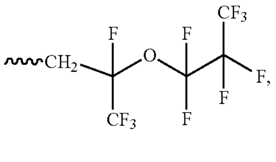

-continued (If1)

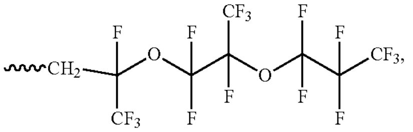

(If2)

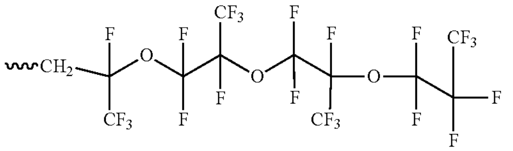

(If3)

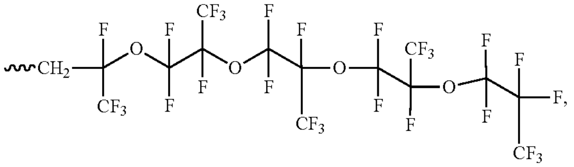

(If4)

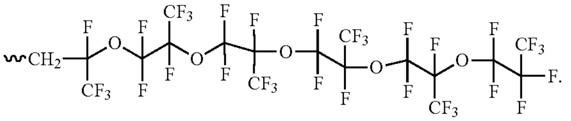

(If5)

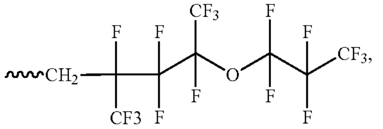

(If6)

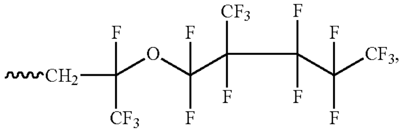

(If7)

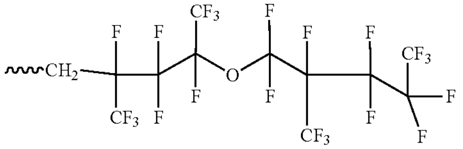

(If8)

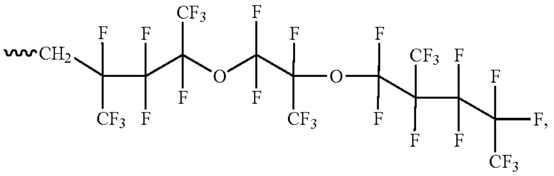

(If9)

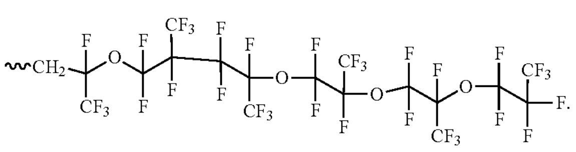

(If10)

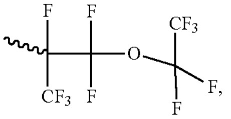

-continued (If11)

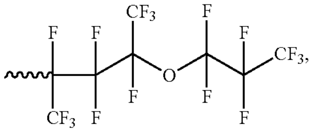

(If12)

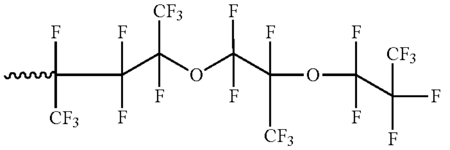

(If13)

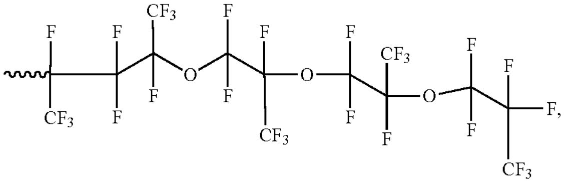

(If14)

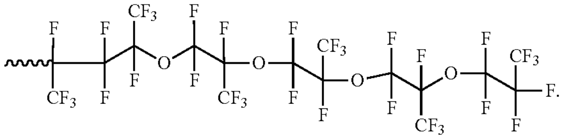

(If15)

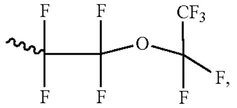

(If16)

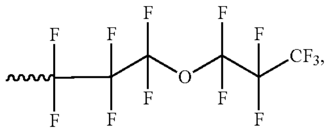

(If17)

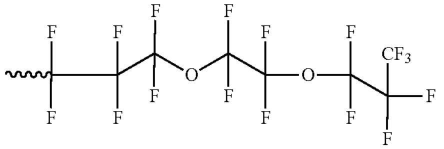

(If18)

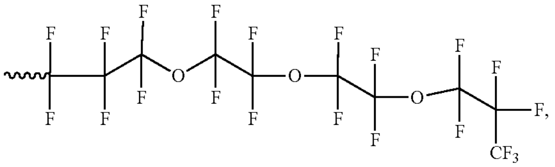

(If19)

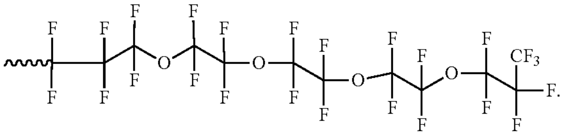

The term "alkylene" refers to hydrocarbon groups which can be linear, branched or cyclic which has two or more attachment points (e.g., of two attachment points: methylene, ethylene, 1,2-isopropylene, a 1,4-cyclohexylene and the like; of three attachment points 1,1,1-substituted methane, 1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

The term “aryl” or “aromatic groups” refers to such groups which contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents, e.g., alkyl, alkoxy, acyl or aryl groups mentioned hereinabove.

The term “arylene” refers to an aromatic hydrocarbon moiety which has two or more attachment points (e.g., 2-5), this moiety may be a single benzene moiety (e.g., two attachment points 1,4-phenylene, 1,3-phenylene and 1,2-phenylene; three attachment points 1,2,4-substituted benzene, 1,3,5-substituted benzene and the like), a polycyclic aromatic moiety with two attachment points such derived from naphthalene, anthracene, pyrene and the like, or a multiple benzene rings in a chain which have two attachment point (e.g., biphenylene). In those instances where the aromatic moiety is a fused aromatic ring, these may be called fused ring arylenes, and more specifically named, for instance, naphthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5 to 10 carbon atoms.

The term “arene” encompasses aromatic hydrocarbon moieties comprising 1 ring or 2 to 8 carbon based aromatic rings fused together.

In a chemical structure herein, when a letter parameter (e.g. x, x2, x3, x4, y, y1, y2, y3 etc.) is designated as representing “the number of repeat units,” this term indicates that this describes a structure or part of a structure which is polymeric in nature The term “heteroarene” refers to an arene which contains 1 or more trivalent or divalent heteroatoms respectively in such a way as to retain its aromaticity. Examples of such hetero atoms are N, O, P, and S. As non-limiting examples, such heteroarenes may contain from 1 to 3 such hetero atoms.

Unless otherwise indicated in the text, the term “substituted” when referring to an aryl, alkyl, alkyloxy, fluoroalkyl, fluoroalkyloxy, fused aromatic ring, arene, heteroarene refers to one of these moieties which also contain with one or more substituents, selected from the group of unsubstituted alkyl, substituted alkyl, unsubstituted aryl, alkyloxyaryl (alkyl-O-aryl-), dialkyloxyaryl ((alkyl-O-)$_2$-aryl), haloaryl, alkyloxy, alkylaryl, haloalkyl, halide, hydroxyl, cyano, nitro, acetyl, alkylcarbonyl, formyl, ethenyl ($CH_2$=CH—), phenylethenyl (Ph-CH=CH—), arylethenyl (Aryl-CH=CH), and substituents comprising ethenylenearylene moieties (e.g., Ar(—CH=CH—Ar—)$_z$ where z is 1-3. Specific, non-limiting examples of substituted aryl and substituted aryl ethenyl substituent are as follows where “ ∿∿∿ ” represents the point of attachment:

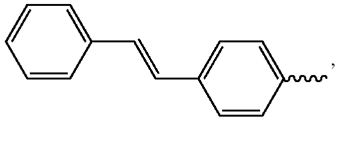
,

-continued

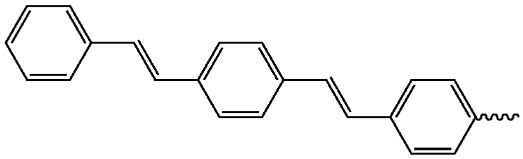
and

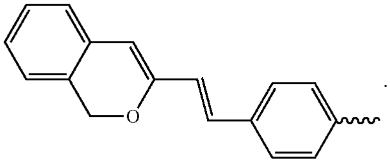
.

Otherwise, substituted aryl, and substituted ethenyls, where the substituent is selected from any of the above substituents. Similarly, the term “unsubstituted” refers to these same moieties, wherein no substituents apart from hydrogen is present. As used herein, unless otherwise indicated, aryl refers to an aromatic moiety with one attachment point (e.g., phenyl, anthracyl, naphthyl and the like). Apart from the attachment point, aryl group may be substituted with alkyl groups, aryl groups or halides (e.g., F, Cl, I, Br). Arylene refers to an aromatic moiety with more than 1 attachment point. Apart from the attachment points, arylene group may be substituted with alkyl groups, or halides (e.g., F, Cl, I, Br) or aryl groups. Alkyl refers to a linear, branched or cyclic alkane moiety with one attachment point (e.g., methyl, ethyl, propyl, n-butyl, tert-butyl, cyclohexyl and the like). Apart from the attachment point, alkyl groups may be substituted with alkyl groups, aryl groups or halides (e.g., F, Cl, I, Br). Alkylene refers to a linear, branched or cyclic alkane moiety with more than one attachment point. Apart from the attachment point, alkylene groups may be substituted with alkyl groups, aryl groups, or halides (e.g., F, Cl, I, Br).

The term “-b-” refers to “-block-” and designates monomer repeat units that form block copolymer. The term “P” refers to “poly” when in front of a monomer acronym it designates the polymerized monomer (e.g., PS, designates poly(styrene) because S is the defined acronym for styrene).

In one embodiment the invention pertains to a block polymer comprising structure (1).

(A)-(C)-(B) (1)

In structure (1), (A) is a polymer block segment comprising a copolymer block segment selected from structure (1a), structure (1b), and a mixture of structures (1a) and (1b), wherein Ar, $Ar_a$, $Ar_b$, and $Ar_e$, are independently unsubstituted aryl moieties or aryl moieties with at least one substituent selected from the group consisting of a C-1 to C-8 alkyl, and a moiety comprising a C-5 to C-18 perfluoroalkyl with at least one ether linkage, x, x1, x2 and x3 and x4 are independently the number of repeat units.

Structures (1a1) (1a2) and (1a3), which are present in structure (1a), structure (1b) or a mixture of structures (1a) and (1b), are present in amounts such that the mole % of structure (1a1) ranges from about 3 mole % to about 40 mole %, as measured against to sum of structures (1a1) (1a2), and (1a3). Further, the $M_w$ of (A) ranges from about 5,000 to about 100,000 g/mole.

(1a)

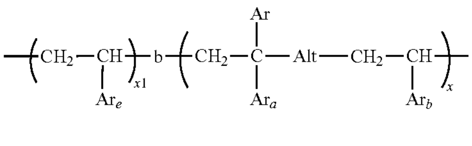

-continued (1b)

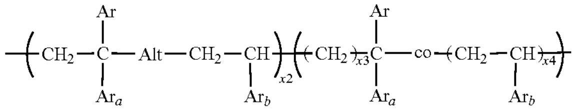

(1a1)

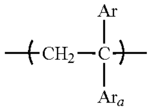

(1a2)

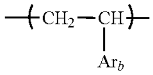

(1a2)

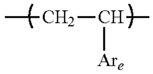

In structure (1), (C) is a spacer moiety comprising structure (1c), wherein $Ar_c$ and $Ar_d$ are independently unsubstituted aryl moieties or aryl moieties with at least one substituent selected from the group consisting a C-1 to C-8 alkyl, and a moiety comprising a C-5 to C-18 perfluoroalkyl with at least one ether linkage.

(1c)

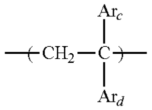

In structure (1), (B) is a second polymer block segment comprising repeat units derived from an alkyl 2-methylene-alkanoate (alkyl-O—(C═O)—C(alkyl)═$CH_2$), a lactone; a cyclic carbonate, an oxirane, or an oxetane, wherein the Mw of (B) ranges from about 5,000 g/mol to about 100,000 g/mol.

The block copolymer comprising structure (1) has a $M_w$ ranging from about 10,000 g/mol to about 200,000 g/mol and has a polydispersity of 1.00 to about 1.20.

In another embodiment the above described inventive block copolymers has a polydispersity ranging from 1.00 to about 1.12. In another aspect of this embodiment it has a polydispersity ranging from 1.00 to about 1.10. In another aspect of this embodiment it has a polydispersity ranging from 1.00 to about 1.08.

In another aspect of the above described the inventive block copolymer it is a block copolymer which can undergo self-assembly and form a finger print pattern on a standard neutral layer substrate such as derived from a random brush copolymer of styrene and methyl methacrylate, which acts a neutral layer for standard DSA block copolymer, such as block copolymers of styrene and methyl methacrylate.

In another aspect of the above described inventive block copolymer it is a block copolymer which can form L/S directed self-assembly, affecting either line multiplication or line rectification, using graphoepitaxy or chemoepitaxy L/S directly patterns on a substrate containing, as part of the this L/S directing pattern, conventional neutral layer surfaces derived from a standard neutral layer. In one aspect of this embodiment this neutral layer can be a brush random copolymer of styrene and methyl methacrylate, which acts a neutral layer for conventional DSA block copolymer such as block copolymers of styrene and methyl methacrylate which have a chi parameter of 0.04 or less.

In another embodiment of the above described inventive block copolymers (A) comprises a block copolymer segment of structure (1a). In another aspect of this embodiment (A) consists of structure (1a).

In another embodiment of the above described inventive block copolymers (A) comprises structure (1b). In another aspect of this embodiment (A) consists of structure (1b).

In another embodiment of the above described inventive block copolymers (A) comprises a mixture of structure (1a) and (1b). In another aspect of this embodiment (A) consists of a mixture of structures (1a) and (1b).

In another embodiment of the above described inventive block copolymers (C) comprises structure (1c). In another aspect of this embodiment (C) consists of structure (1c).

In another embodiment of the above described inventive block copolymers it is one wherein (C) comprises structure (1c1) wherein Rs an unsubstituted C-1 to C-3 alkylene moiety or C-1 to C-3 alkylene moiety substituted with at least one substituent selected from the group consisting of consisting a C-1 to C-8 alkyl, and a moiety comprising a C-5 to C-18 perfluoroalkyl with at least one ether linkage, $Ar_c$, and $Ar_d$ are independently unsubstituted aryl moieties or aryl moieties with at least one substituent selected from the group consisting a C-1 to C-8 alkyl, and a moiety comprising a C-5 to C-18 perfluoroalkyl with at least one ether linkage. In another aspect of this embodiment, at least one of $Ar_c$ or $Ar_d$ is substituted with at least one moiety comprising a C-5 to C-18 perfluoroalkyl with at least one ether linkage. In another aspect of this embodiment $Ar_c$ and $Ar_d$ are not substituted with a moiety comprising a C-5 to C-18 perfluoroalkyl with at least one ether linkage. In another aspect of this embodiment, $Ar_c$ and $Ar_d$ are unsubstituted. In another aspect of this embodiment, at least one $Ar_c$ or $Ar_d$ are is unsubstituted. In another aspect of this embodiment, at least one of $Ar_c$ is substituted with a C-1 to C-8 alkyl. In another aspect of this embodiment (C) consists of structure (1c1).

(1c1)

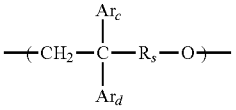

In another embodiment of the above described inventive block copolymers it is one wherein (B) is a polymer block segment whose repeat units are derived from an alkyl 2-methylenealkanoate as described above.

In another aspect of this embodiment is it derived from an alkyl methacrylate. In another aspect of this embodiment is it selected from methyl methacrylate, ethyl methacrylate, butyl methacrylate.

In another embodiment of the above described inventive block copolymers it is one wherein (B) is a polymer block segment whose repeat units are derived from a lactone. In one aspect of this embodiment said lactone is selected from a mono lactone or a di-lactone. In another aspect of this embodiment said mono lactone is a 5 or 8 membered ring mono-lactone (e.g. γ-butyrolactone (GBL), ε-caprolactone, and the like). In another aspect of this embodiment said lactone is a di-lactone (e.g. Lactide and the like). In another aspect said lactone is lactide.

In another embodiment of the above described inventive block copolymers it is one wherein (B) is a polymer block segment whose repeat units are derived from a cyclic carbonate. In one aspect of this embodiment said cyclic carbonate in one which has a 5 or 6 membered. In one aspect of this embodiment said cyclic carbonate is a 5 or 8 membered ring cyclic carbonate which is unsubstituted or substituted with at least one substituent selected from a C-1 to C-8 alkyl, a C-4 to C-8 alkylenealkyl, a C-1 to C-8 alkylene hydroxy, and an aryl, in another aspect of this embodiment it is a 5 to 6 membered ring cyclic carbonate. In one aspect of this embodiment said cyclic carbonate is selected from 1,2-propylene carbonate, ethylene carbonate, butylene carbonate, styrene carbonate and propylene carbonate. In another aspect of this embodiment it is selected from 1,2-propylene carbonate and ethylene carbonate.

In another embodiment of the above described inventive block copolymers it is one wherein (B) is a polymer block segment whose repeat units are derived from an oxirane. In another aspect of this embodiment said oxirane may be ethylene oxide or an ethylene oxide derivative which is substituted with at least one substituent selected from with at least one substituent selected from a C-1 to C-8 alkyl, a C-4 to C-8 alkylenealkyl, a C-1 to C-8 alkylene hydroxy, an aryl.

In another embodiment of the above described inventive block copolymers it is one wherein (B) is a polymer block segment whose repeat units are derived from an oxetane In another embodiment of the above described inventive block copolymers it is one which has structure (2), which has structure (2), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_6$ is a C-1 to C-4 alkyl, $R_4$ is selected from the group consisting of H, a C-1 to C-8 alkyl, and a moiety comprising a C-5 to C-18 perfluoroalkyl with at least one ether linkage, and x1, x, and y are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy). One aspect of this embodiment wherein $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(2)

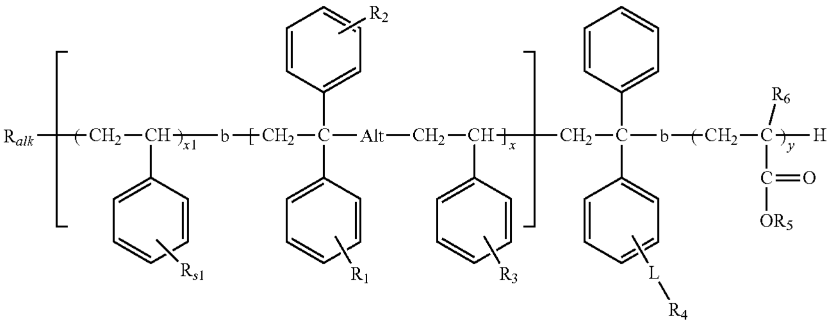

In another embodiment of the above described inventive block copolymers it is one which has structure (3), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_6$ is a C-1 to C-4 alkyl, x2, x3, x4 and y are independently the number of the respective repeat units, and L is a linking group selected from the group consisting of a direct valence bond, a C-1 to C-4 alkylene spacer, a C-1 to C-4 alkylene-oxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(3)

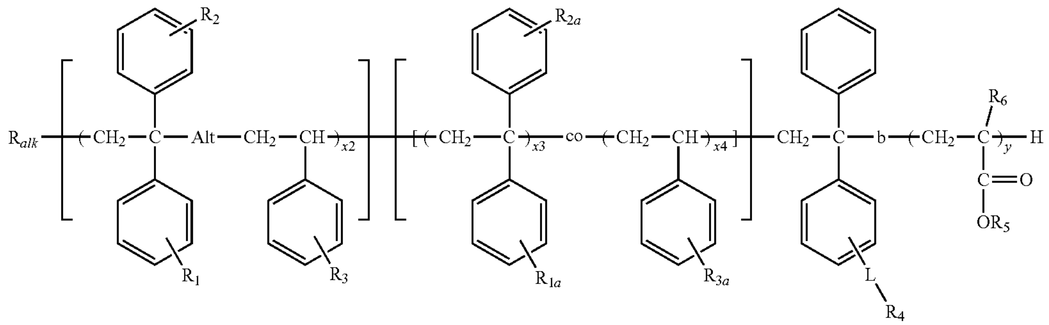

In another embodiment of the above described inventive block copolymers it is one which has structure (4), which has structure (4), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_6$ is a C-1 to C-4 alkyl, x, x1, x2, x3, x4 and y are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(4)

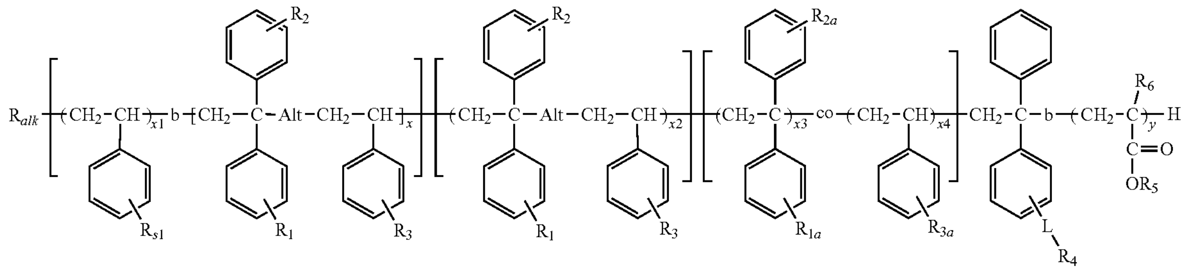

In another embodiment of the above described inventive block copolymers it is one which has structure (5), which has structure (5), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_{L1}$ is an unsubstituted C-1 to C-4 alkylene or a C-1 to C-4 alkylene moiety substituted with at least one C-1 to C-8 alkyl, $R_{cap}$ is a C-1 to C-8 alkyl, and x1, x, and y1 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(5)

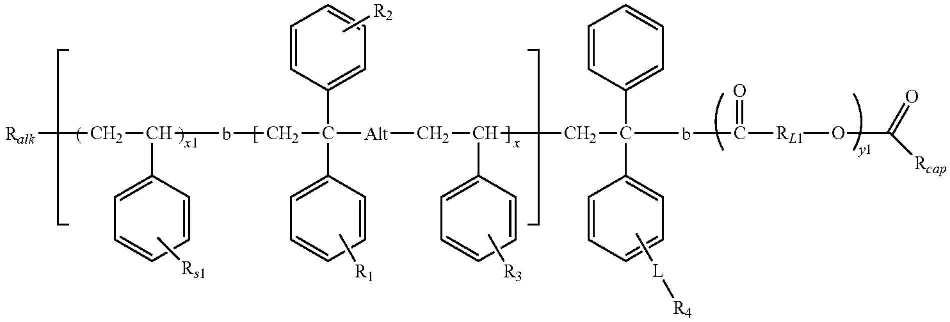

In another embodiment of the above described inventive block copolymers it is one which has structure (6), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_L$ is an unsubstituted C-1 to C-4 alkylene or a C-1 to C-4 alkylene moiety substituted with at least one C-1 to C-8 alkyl, $R_{cap}$ is a C-1 to C-8 alkyl, x2, x3, x4, and y1 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(6)

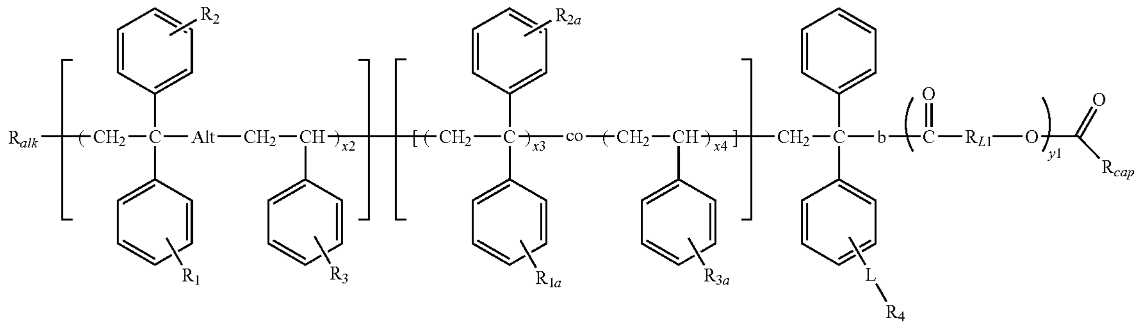

In another embodiment of the above described inventive block copolymers it is one which has structure (7), which has structure (7), wherein $R_{alk}$ is a C-1 to C-8 alkyl, $R_1$, $R_{1a}$, $R_2$, $R_{2a}$, $R_3$, and $R_{3a}$, are independently selected from H, and a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ is an unsubstituted C-1 to C-4 alkylene or a C-1 to C-4 alkylene moiety substituted with at least one C-1 to C-4 alkyl, x1, x, x2, x3, x4 and y1 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(=O)-alkylene) moiety and a C-2 to C-4 alkyleneoxyalkylene spacer (-alkylene-oxy-alkylene). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(7)

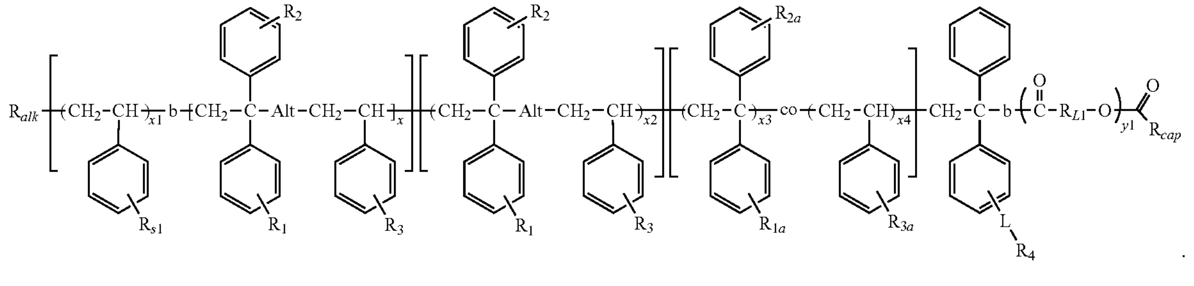

In another embodiment of the above described inventive block copolymers it is one which has structure (8), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ and $R_{l2}$ are independently an unsubstituted C-1 to C-4 alkylene or a C-1 to C-4 alkylene moiety substituted with at least one C-1 to C-4 alkyl, $R_{cap}$ is a C-1 to C-8 alkyl, and x1, x, and y1 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(8)

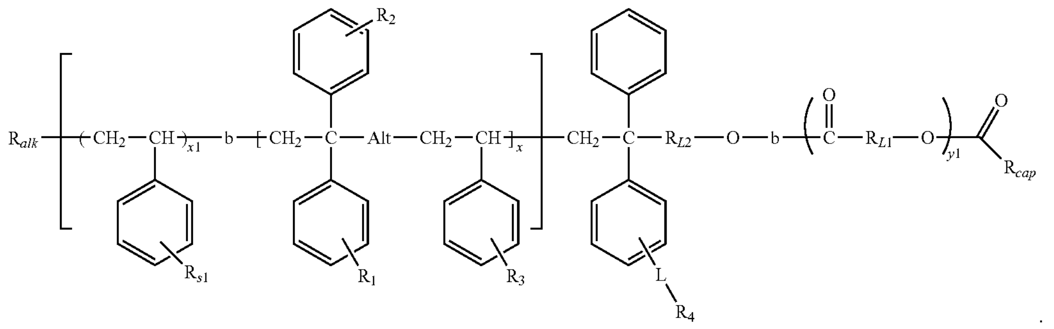

In another embodiment of the above described inventive block copolymers it is one which has structure (9), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{L1}$ and $R_{L2}$ are independently an unsubstituted C-1 to C-4 alkylene or a C-1 to C-4 alkylene moiety substituted with at least one C-1 to C-4 alkyl, $R_{cap}$ is a C-1 to C-8 alkyl, and x, x1, x2, and y1 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(9)

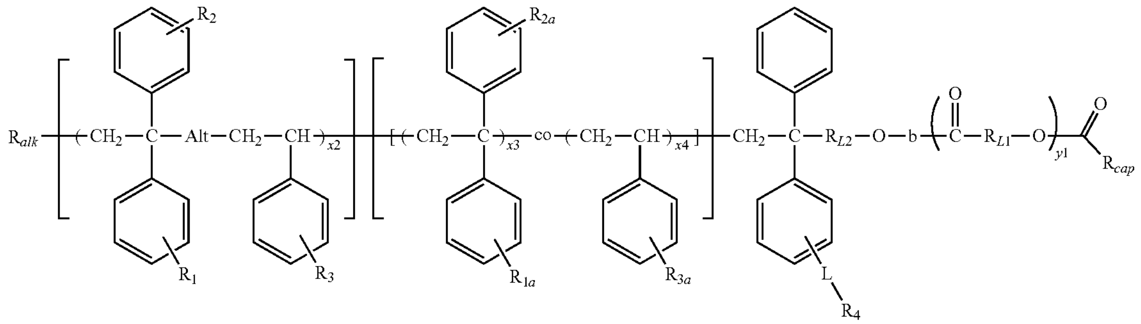

In another embodiment of the above described inventive block copolymers it is one which has structure (10), wherein $R_{alk}$ is a C-1 to C-8 alkyl, $R_{s1}$, $R_1$, $R_{1a}$, $R_2$, $R_{2a}$, $R_3$, and $R_{3a}$, are independently selected from H, and a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ and $R_{L2}$ are independently an unsubstituted C-1 to C-4 alkylene or a C-1 to C-4 alkylene moiety substituted with at least one C-1 to C-4 alkyl, x1, x, x2, x3, x4 and y1 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(═O)-alkylene) moiety and a C-2 to C-4 alkyleneoxyalkylene spacer (-alkylene-oxy-alkylene). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(10)

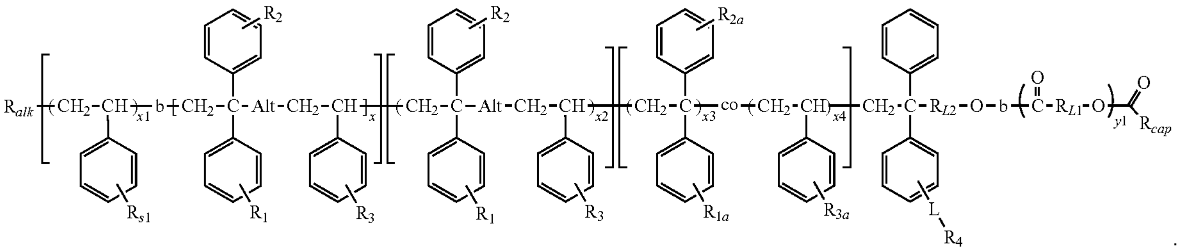

.

In another embodiment of the above described inventive block copolymers it is one which has structure (11), wherein $R_{alk}$ is a C-1 to C-8 alkyl, $R_{s1}$, $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L3}$ is an unsubstituted C-2 to C-3 linear alkylene or a C-2 to C-3 linear alkylene moiety substituted with at least one C-1 to C-4 alkyl, $R_{cap1}$ is a C-1 to C-8 alkyl or a C-2 to C-8 carbonylalkyl, and x1, x, and y2 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(11)

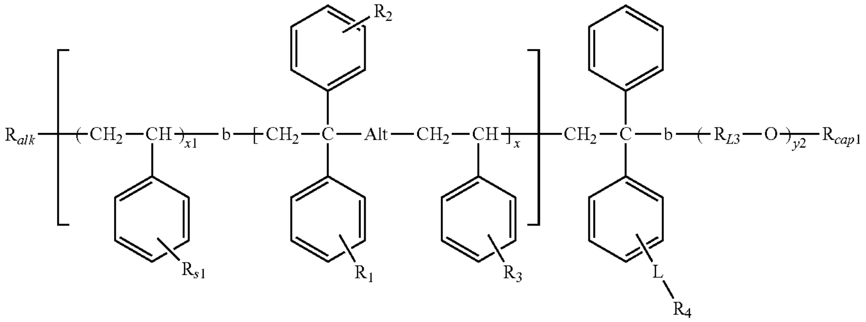

In another embodiment of the above described inventive block copolymers it is one which has structure (12), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{L3}$ is an unsubstituted C-2 to C-3 linear alkylene or a C-2 to C-3 linear alkylene moiety substituted with at least one C-1 to C-4 alkyl, $R_{cap1}$ is a C-1 to C-8 alkyl or a C-2 to C-8 carbonylalkyl, and x, x1, x2, and y2 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(12)

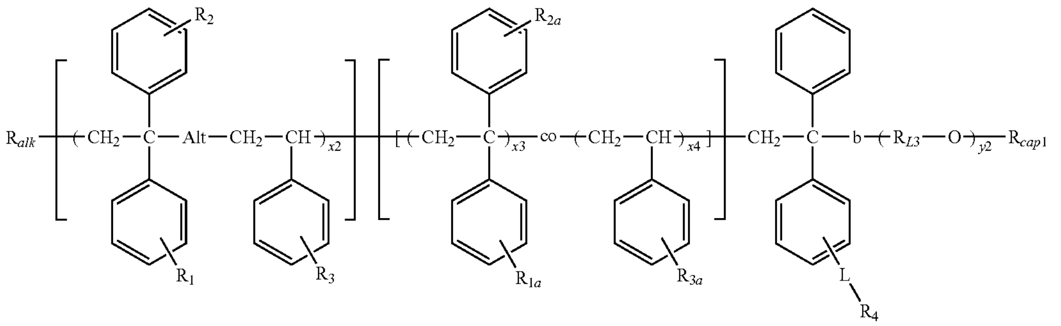

In another embodiment of the above described inventive block copolymers it is one which has structure (13), wherein $R_{alk}$ is a C-1 to C-8 alkyl, $R_{s1}$, $R_1$, $R_{1a}$, $R_2$, $R_{2a}$, $R_3$, and $R_{3a}$, are independently selected from H, and a C-1 to C-8 alkyl, $R_4$ is selected from the group consisting of H, a C-1 to C-8 alkyl, and a moiety comprising a C-5 to C-18 perfluoroalkyl with at least one ether linkage, is an unsubstituted C-2 to C-3 linear alkylene or a C-2 to C-3 linear alkylene moiety substituted with at least one C-1 to C-4 alkyl, $R_{L3}$ is an unsubstituted C-2 to C-3 linear alkylene or a C-2 to C-3 linear alkylene moiety substituted with at least one C-1 to C-4 alkyl, $R_{cap1}$ is a C-1 to C-8 alkyl or a C-2 to C-8 carbonylalkyl, x1, x, x2, x3, x4 and y2 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(═O)-alkylene) moiety and a C-2 to C-4 alkyleneoxyalkylene spacer (-alkylene-oxy-alkylene). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(13)

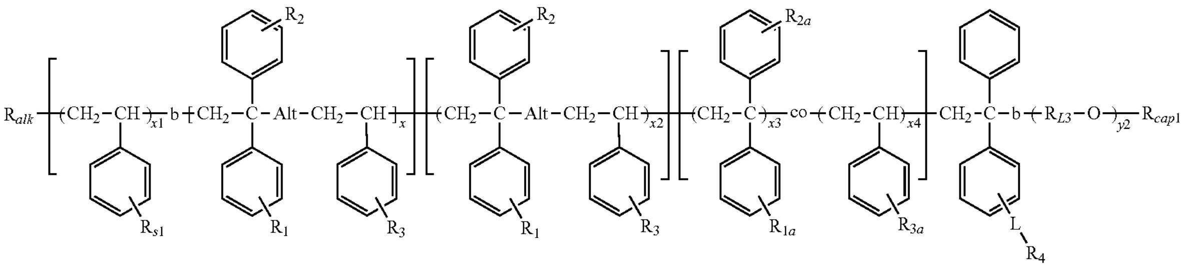

In another embodiment of the above described inventive block copolymers it is one which has structure (14), wherein Rai is a C-1 to C-8 alkyl, $R_{s1}$, $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L4}$ is an unsubstituted C-2 to C-3 linear alkylene or a C-2 to C-3 linear alkylene moiety substituted with at least one C-1 to C-4 alkyl, $R_{cap2}$ is a C-1 to C-8 alkyl, $R_{cap1}$ is a C-1 to C-8 alkyl or a C-2 to C-8 carbonylalkyl, x1, x, and y3 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(14)

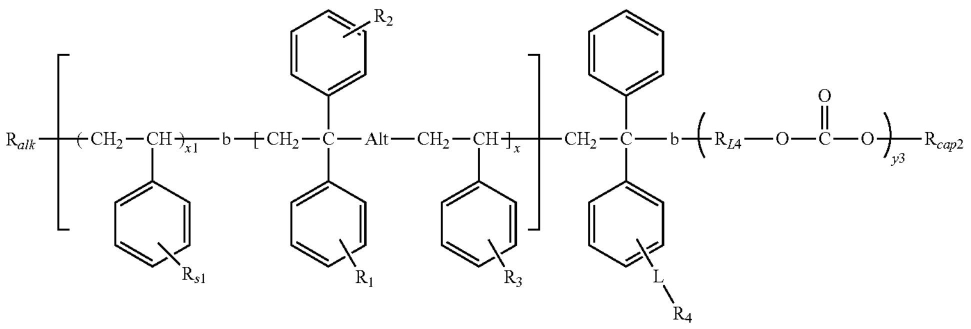

In another embodiment of the above described inventive block copolymers it is one which has structure (15), wherein $R_{a1}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{L4}$ is a C-2 to C-4 alkylene or a C-1 to C-4 alkylene moiety substituted with at least one C-1 to C-4 alkyl, $R_{cap2}$ is a C-1 to C-8 alkyl or a C-2 to C-8 carbonylalkyl, x2, x3, x4 and y3 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(15)

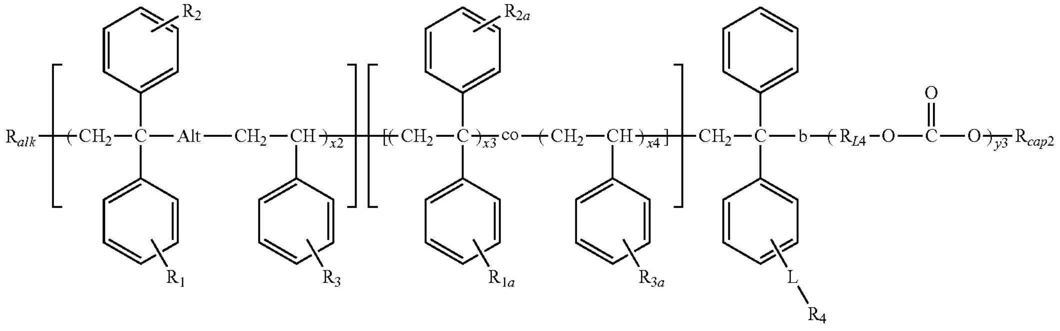

In another embodiment of the above described inventive block copolymers it is one which has structure (16), wherein $R_{alk}$ is a C-1 to C-8 alkyl, $R_{s1}$, $R_1$, $R_{1a}$, $R_2$, $R_{2a}$, $R_3$, and $R_{3a}$, are independently selected from H, and a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L4}$ is an unsubstituted C-2 to C-4 alkylene or a C-2 to C-4 alkylene moiety substituted with at least one C-1 to C-4 alkyl, $R_{cap2}$ is a C-1 to C-8 alkyl or a C-2 to C-8 carbonylalkyl, x1, x, x2, x3, x4 and y3 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(=O)-alkylene) moiety and a C-2 to C-4 alkyleneoxyalkylene spacer (-alkylene-oxy-alkylene). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(16)

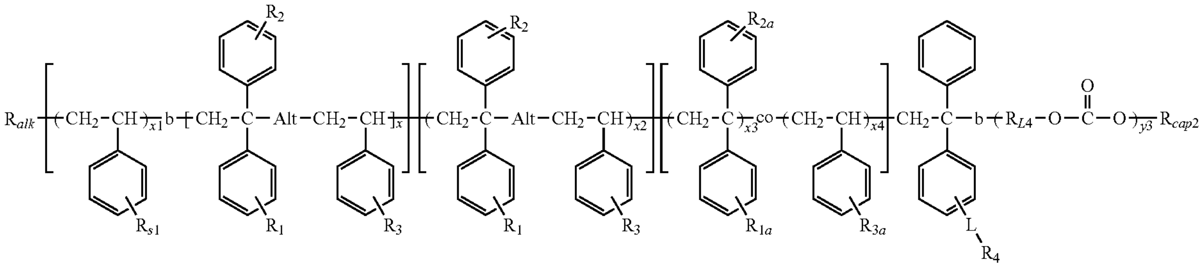

In another embodiment of the above described inventive block copolymers it is one which has structure (17), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{l2}$ and $R_{L4}$ are independently an unsubstituted C-1 to C-4 alkylene or a C-1 to C-4 alkylene moiety substituted with at least one C-1 to C-4 alkyl, $R_{cap2}$ is a C-1 to C-8 alkyl or a C-2 to C-8 carbonylalkyl, x1, x, and y3 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(17)

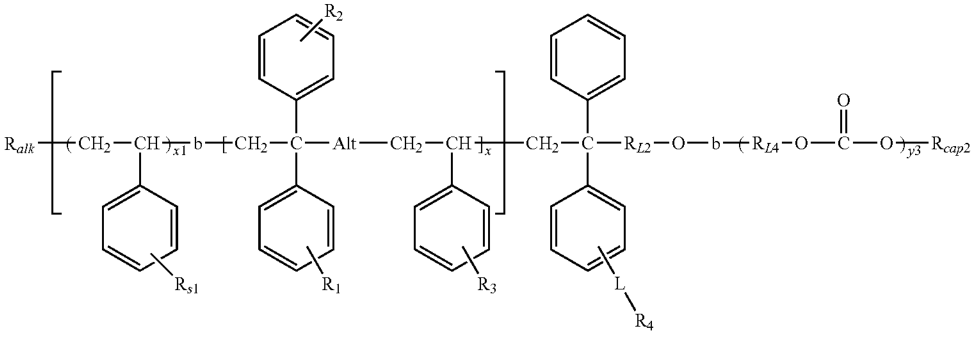

In another embodiment of the above described inventive block copolymers it is one which has structure (18), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{l2}$ and $R_{L4}$ are independently an unsubstituted C-1 to C-4 alkylene or a C-1 to C-4 alkylene moiety substituted with at least one C-1 to C-4 alkyl, $R_{cap2}$ is a C-1 to C-8 alkyl or a C-2 to C-8 carbonylalkyl, x2, x3, x4 and y3 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy). In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

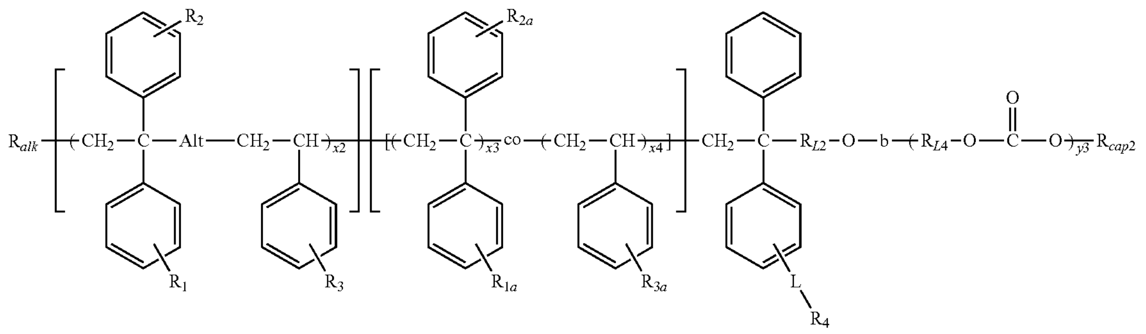

In another embodiment of the above described inventive block copolymers it is one which has structure (19), wherein $R_{alk}$ is a C-1 to C-8 alkyl, $R_1$, $R_{1a}$, $R_2$, $R_{2a}$, $R_3$, and $R_{3a}$, are independently selected from H, and a C-1 to C-8 alkyl, $R_{l2}$ and $R_{L4}$ are independently an unsubstituted C-1 to C-4 alkylene or a C-1 to C-4 alkylene moiety substituted with at least one C-1 to C-4 alkyl, $R_4$ is selected from the group consisting of H, a C-1 to C-8 alkyl, and a moiety comprising a C-5 to C-18 perfluoroalkyl with at least one ether linkage, $R_{L4}$ is an unsubstituted C-2 to C-4 alkylene or a C-2 to C-4 alkylene moiety substituted with at least one C-1 to C-4 alkyl, $R_{cap2}$ is a C-1 to C-8 alkyl or a C-2 to C-8 carbonylalkyl, x1, x, x2, x3, x4 and y3 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(=O)-alkylene) moiety and a C-2 to C-4 alkyleneoxyalkylene spacer (-alkylene-oxy-alkylene) In another aspect of this embodiment $R_4$ is a moiety comprising a C-5 to C-18 perfluoroalkyl with at least one ether linkage. In another aspect of this embodiment $R_4$ is H. In another aspect of this embodiment $R_4$ is a C-1 to C-8 alkyl.

(19)

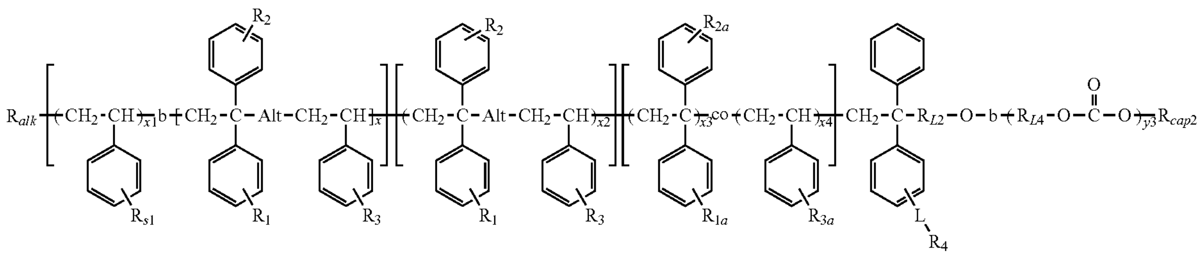

Another embodiment of this invention is an inventive composition which is comprised of at least one of any of the above described inventive block copolymer of structure (1) and its substructures and a solvent.

For composition comprising at least novel block copolymer of structure (1) (or substructures described herein), and a solvent or mixture of solvents; suitable solvents dissolving either the novel block copolymer of structure (1) alone or in a composition with other components include standard spin casting solvents such as the non-limiting examples of propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. In an embodiment, specifically useful casting solvents include propylene glycol monomethyl ether acetate (PGMEA), gamma-butyrolactone (GBL), or a combination of these solvents. The wt % of the novel block copolymer having structure (1) in a solvent may range from about 0.2 to about 10 wt %. In another embodiment the range may be from 0.5 to 10 wt %. In yet another embodiment the range may be 0.5 to 5 wt %. In yet another more specific embodiment the range may be about 0.8 to about 1.2 wt %. In another aspect of this embodiment said novel block copolymer of structure (1) has a polydispersity from 1.0 to about 1.1 and a Mw ranging from about 30,000 g/mole to about 100,000 g/mole.

The inventive compositions described herein containing at least one block copolymer of structure (1) (or any of its substructures), alone or blended with other polymers as described herein are high chi material (chi>0.04) may be used in directed self-assembly using either graphoepitaxy or chemoepitaxy approaches. Specifically, in graphoepitaxy DSA where most of the novel block copolymer or a blend comprising at least one block copolymer of structure (1) is confined within the recessed region in the topographical prepattern, the domains of this novel composition subdivide the recessed region. Thus, coating of this novel block copolymer composition over a shallow, periodic topographical line and space (L/S) prepattern where the domains of this block copolymer are aligned perpendicular to the substrate at the bottom of the guiding pattern, even when this substrate comprises conventional neutral layer substrate surfaces areas (e.g. brush random copolymer of styrene and methyl methacrylate and the like), normally employed for non-high-chi block copolymers such as a block copolymer of styrene and methyl methacrylate which has a chi parameter of 0.04 or less). Similarly, these novel compositions may also be used for chemoepitaxy DSA where a film comprising at these novel high chi formulations is coated over a chemical prepattern comprised of preferential and non-preferential regions (such as the non-limiting example of a conventional neutral region) with domains of the inventive block copolymer aligned to the wetting features. Unlike, conventional block polymers, the inventive high chi block formulation containing copolymer of structure (1), do not require the presence of substantially non-preferential regions and therefore provide the wider process latitude with respect to underlayer surface affinity. That is, these novel materials can form domains which orient perpendicular to the substrate during self-assembly for a wider range of underlayer surface property. If the graphoepitaxy or chemoepitaxy guiding pattern described above is a L/S guiding pattern this will result in the domains orienting themselves to form a L/S pattern between these guiding features to affect L/S pattern multiplication. In the same manner an existing contact hole CH prepattern may also be made to undergo pattern multiplication. Instead of pattern rectification these formulations may also be used to affect pattern rectification of existing pattern (e.g. L/S pattern, Contact hole pattern etc.) The high chi Characteristic of formulations comprising the inventive block copolymer of structure (1), can enable more robust SA performance across surfaces with imperfect or non-uniform surface properties, for example. The imperfect or non-uniform surface properties may be the result of damage, contamination, imperfect deposition/grafting conditions, impurities, poor compositional uniformity of the underlayer material, or other reasons.

In another aspect of this invention the novel composition comprised of the block copolymer having structure (1) is employed in a method for vertically orienting first and second block copolymer domains over an unpatterned substrate using a layer of a block copolymer having a periodicity of $L_0$ comprising steps a) and b); wherein, said substrate is a convention neutral layer such as brush random copolymer of styrene and methyl methacrylate, or some other organic polymer which may act as a conventional neutral layer used for non-high chi polymer conventional block-copolymer such as block copolymers of styrene and methyl methacrylate which have a chi parameter of 0.04 or less). $L_0$ is the natural pitch of an assembled block copolymer and tends to be proportional to the size of the copolymer.

In one embodiment of this inventive composition, the inventive block copolymer of structure (1), is used as a single block copolymer component in a composition with a solvent for use in a directed self-assembly (DSA) process as a high-chi block copolymer on the existing conventional neutral underlayers and pinning materials used for non-high chi block copolymers such as block polymer of PS-b-PMMA and other non-high-chi block copolymers as describe herein. In one aspect of this embodiment the directed-self-assembly process is a chemoepitaxy process. In another aspect of this embodiment this directed self-assembly process is a chemoepitaxy process.

In another aspect of this inventive composition, the block copolymers of structure (1) and its substrates can used as at least one polymer component in a solvent which also contains another type polymer such as a homopolymer or a block polymer which is not of structure (1) for directed self-assembly (DSA) as a high-chi block material on the conventional neutral underlayers and pinning materials used for non-high chi block copolymers such as block polymer of PS-b-PMMA and other non-high block copolymers(as describe herein), to affect perpendicular orientation on this substrate.

To demonstrate this in the Examples section herein conventional neutral layer were used to affect directed self-assembly. A conventional neutral layer whose polymer synthesis and formulation are describe respectively in "Neutral Underlayer Synthesis Example 1," and "Preparation of P(S-co-MMA) or PMMA-OH brush solutions."

Other types of conventional neutral layers may also be used with the inventive high chi composition described herein to affect perpendicular orientation of block copolymer domains in either graphoepitaxy or chemoepitaxy processing. of the inventive block copolymer of structure (1), apart from random brush copolymer of styrene and methyl methacrylate other type of polymers or inorganic neutral layer substrate surface areas as known in the art may be used in chemoepitaxy or graphoepitaxy employing formulations comprising the inventive block copolymer of structure (1). As non-limiting examples, a substrate which has a coating of high carbon underlayer, or a high carbon polymer underlayer, and a neutral silicon antireflective coating may be used as a conventional neutral layer on a substrate. The high carbon underlayer can have coating thickness of about 20 nm to about 2 microns. In some embodiment the high carbon underlayer is overcoated with a silicon antireflective coating of about 10 nm to about 100 nm. In instances where an orientation of the self-assembled cylinder of the novel block copolymer perpendicular to the substrate is desired a conventional neutral layer may also be employed.

The inventive block copolymers of structure (1) may be used in formulation containing at least one of these employed also in a variety of other substrates which are used as conventional neutral layers such as those prepared by chemically vapor deposition (CVD), physical vapor deposition (PVD) and atomic layer deposition (ALD). The preparation of substrates using these CVD and PVD is discussed in the following reference: "HANDBOOK OF THIN-FILM DEPOSITION PROCESSES AND TECHNIQUES, Principles, Methods, Equipment and Applications, Second Edition, Edited by Krishna Seshan, Intel Corporation, Santa Clara, California, Copyright © 2002 by Noyes Publications, Library of Congress Catalog Card Number: 2001135178, ISBN: 0-8155-1442-5, Noyes Publications/William Andrew Publishing, 13 Eaton Avenue Norwich, NY 13815, Chapter 1 title: Deposition Technologies and Applications: Introduction and Overview, page 11-page 43, Chapter 1 Authors: Werner Kern and Klaus K. Schuegraf" The preparation of substrates by ALD is described in the following reference: "Chemical Review 2010, 110, page 111-131."

These conventional neutral layers are used with non-high-chi block copolymer having a chi parameter of 0.04 or less, such as the non-limiting example of block copolymers of styrene and methyl methacrylate.

Solutions containing the novel block copolymer of structure (1) can further comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

In another embodiment of this invention, the inventive composition comprising the first block copolymer of structure (1) may further contain a second different block copolymer than block copolymer of structure (1). In this embodiment of the invention the second block copolymer different from the first block copolymer may be present from about 5 to about 50 wt % of total solids. In another aspect of this embodiment said second block copolymer has a polydispersity ranging from 1.0 to about 1.1, and a Mw ranging from about 30,000 g/mole to about 100,000 g/mole.

In a further embodiment of the inventive composition, the composition comprises the block copolymer of structure (1) and a second different block copolymer which comprises blocks derived from either ethylenically unsaturated monomers or cyclic monomers as described above for the novel block copolymers.

A specific example of a suitable second diblock copolymer containing a high etch resistant block and a highly etchable block would be the block copolymer poly(styrene-b-methylmethacrylate). Typically, the block copolymers suitable for being used in these inventions as an additional component to the inventive block copolymers have a weight-averaged molecular weight ($M_w$) in the range of about 3,000 to about 500,000 g/mol and a number averaged molecular weight ($M_n$) of about 1,000 to about 60,000. In another more specific aspect of this embodiment $M_w$ ranges from about 30,000 g/mole to about 100,000. Another aspect of this embodiment is that the polydispersity of said second different block polymer polydispersity ($M_w/M_n$) (PD) ranges from 1.0 to about 6, or 1.0 to about 2 or 1.0 to about 1.5 or 1.0 to about 1.3, or 1.0 to about 1.2, or 1.0 to about 1.1. In one aspect of this embodiment said second block copolymer is a block copolymer of styrene or a substituted styrene monomer, with a comonomer selected from the group consisting of an alkyl 2-methylenealkanoate (alkyl-O—(C═O)—C(alkyl)=$CH_2$), a lactone; a cyclic carbonate, an oxirane, and an oxetane. Other specific non-limiting examples of second different block copolymers are poly(styrene-b-methyl methacrylate), poly(styrene-b-butadiene), poly(styrene-b-isoprene), poly(styrene-b-methyl methacrylate), poly(styrene-b-alkenyl aromatics), poly(styrene-b-(ethylene-propylene)), poly(styrene-b-t-butyl (meth)acrylate), poly(styrene-b-tetrahydrofuran), poly(styrene-b-ethyleneoxide), poly(styrene-b-dimethylsiloxane), poly(methyl methacrylate-b-dimethylsiloxane), and poly(methylmethacrylate-b-4-vinylpyridine)). All these polymeric materials share in common the presence of at least one block which has repeat units resistant to plasma etching techniques typically employed in manufacturing IC devices, and at least one block which etches rapidly under these same conditions or that can be removed by chemical or photochemical processes. This allows for the directed self-assembled polymer to pattern transfer onto the substrate to affect via formation. In this embodiment of the invention the second block copolymer may be present from 1 to 20 wt %, or more preferentially from about 5 to about 10 wt % of total solids.

A further embodiment of this inventive composition is where the composition comprises, in additional to the inventive block copolymers described herein, a homopolymer as an additional component. This homopolymer may be a homopolymer derived from any of the ethylenically unsaturated monomers or cyclic monomer previously described above as suitable precursors for the block of the novel block copolymer having structure (1). Such a homopolymer component may be present in a composition in a level range from about 0.5 to about 10 wt % or more specifically about 1 to about 5 wt % of solids. In one aspect of this embodiment said homopolymer is derived from an ethylenically unsaturated monomers or a cyclic monomer, whose monomer chemical structures are described in more detail herein. Typically, homopolymer suitable for being used in these inventions as an additional component to the inventive block copolymers have a weight-averaged molecular weight ($M_w$) in the range of about 3,000 to about 500,000 g/mol and a number averaged molecular weight ($M_n$) of about 1,000 to about 60,000. In another more specific aspect of this embodiment $M_w$ ranges from about 30,000 g/mole to about 100,000. Another aspect of this embodiment is that the polydispersity of said homopolymer polydispersity ($M_w/M_n$) (PD) ranges from 1.0 to about 6, or 1.0 to about 2 or 1.0 to about 1.5 or 1.0 to about 1.3, or 1.0 to about 1.2, or 1.0 to about 1.1.

Another inventive composition is a first composition comprising at least two different block copolymers having structure (1), as described herein.

$$(A)\text{-}(C)\text{-}(B) \qquad (1)$$

Specifically, wherein in the different block copolymers in this first composition (A) is a first polymer block segment comprising a copolymer block segment selected from structure (1a), structure (1b), and a mixture of structures (1a) and (1b), wherein Ar, $Ar_a$, $Ar_b$ and $Ar_e$, are independently unsubstituted aryl moieties or aryl moieties with at least one substituent selected from the group consisting of a C-1 to C-8 alkyl, and a moiety comprising a C-5 to C-18 perfluoroalkyl with at least one ether linkage, x, x1, x2 and x3 and x4 are independently the number of repeat units; wherein the structures (1a1) (1a2) and (1a3), which are present in structure (1a), structure (1b) or a mixture of structures (1a) and (1b), are present in amounts such that the mole % of structure (1a1) ranges from about 3 mole % to about 40 mole %, as measured against to sum of structures ((1a1), (1a2) and (1a3); and, wherein the $M_w$ of (A) ranges from about 5,000 to about 100,000 g/mole, (1a)

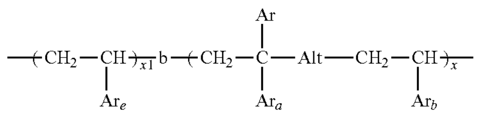

, (1b)

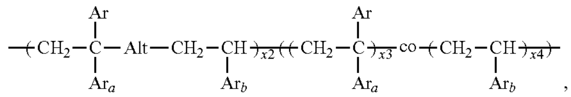

, (1a1)

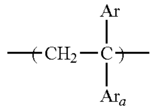

(1a2)

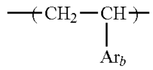

(1a3)

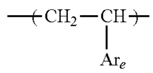

;

Specifically, wherein in the different block copolymers in this first composition, (C) is a spacer moiety comprising structure (1c), wherein $Ar_c$ and $Ar_d$ are independently unsubstituted aryl moieties or aryl moieties with at least one substituent selected from the group consisting of a C-1 to C-8 alkyl, and a moiety comprising a C-5 to C-18 perfluoroalkyl with at least one ether linkage, (1c)

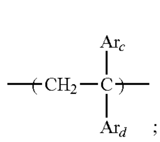

;

Specifically, wherein in the different block copolymers in this first composition, (B) is a second polymer block segment comprising repeat units derived from an alkyl 2-methylenealkanoate, a lactone; a cyclic carbonate, an oxirane, or an oxetane, wherein the Mw of (B) ranges from about 5,000 g/mol to about 100,000 g/mol; wherein said block copolymer comprising structure (1) has a $M_w$ ranging from about 10,000 g/mol to about 200,000 g/mol and has a polydispersity of 1.00 to about 1.20. Further, wherein in the two different block copolymers in this first composition is one wherein at least one said block copolymer in said composition has either $Ar_c$, $Ar_d$, or both substituted with at least a moiety which is substituted with at least one moiety comprising a C-5 to C-18 perfluoroalkyl with at least one ether linkage, and least one said block copolymer in said composition in which neither $Ar_c$ or $Ar_d$ has as a substituent a moiety which is substituted with at least one moiety comprising a C-5 to C-18 perfluoroalkyl with at least one ether linkage.

In one aspect of said first composition, said mixture is one of a first and second block copolymer, wherein said first block copolymer has either $Ar_c$, $Ar_d$, or both substituted with at least one moiety comprising a C-5 to C-18 perfluoroalkyl with at least one ether linkage and wherein (A) consist of either structure (1a), structure (1b) or a mixture of structure (1a) and (1b), and said second block copolymer is one in which (A) consist of structure (1b) and in which neither $Ar_e$, nor $Ar_d$, are substituted with a moiety comprising a C-5 to C-18 perfluoroalkyl with at least one ether linkage. In one aspect of this embodiment said first block copolymer is one wherein (A) consists of structure (1a). In another aspect of this embodiment said first block copolymer is one wherein (A) consists of structure (1b). In another aspect of this embodiment said first block copolymer is one wherein (A) consists of a mixture of structures (1a) and (1b).

Another inventive composition is a second composition comprising of at least two different block copolymers having structure (1).

(A)-(C)-(B) (1)

Specifically, wherein in the different block copolymers in this second composition, (A) is a first polymer block segment comprising a copolymer block segment selected from structure (1a), structure (1b), and a mixture of structures (1a) and (1b), wherein Ar, $Ar_a$ $Ar_b$ and $Ar_e$ are independently unsubstituted aryl moieties or aryl moieties with at least one substituent selected from the group consisting of a C-1 to C-8 alkyl, and a moiety comprising a C-5 to C-18 perfluoroalkyl with at least one ether linkage, x, x1, x2 and x3 and x4 are independently the number of repeat units; wherein the structures (1a1) (1a2) and (1a3), which are present in structure (1a), structure (1b) or a mixture of structures (1a) and (1b), are present in amounts such that the mole % of structure (1a1) ranges from about 3 mole % to about 40 mole %, as measured against to sum of structures ((1a1) (1a2) and (1a3); and, wherein the $M_w$ of (A) ranges from about 5,000 to about 100,000 g/mole.

(1a)

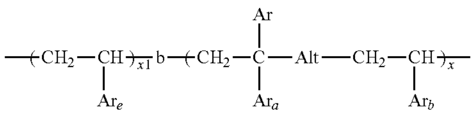

(1b)

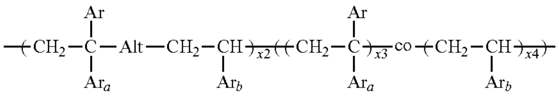

(1a1)

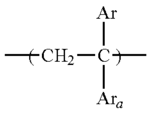

(1a2)

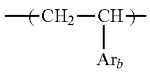

-continued

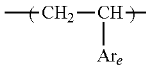

(1a3)

Specifically, wherein in the different block copolymers in this second composition, (C) is a spacer moiety comprising structure (1c), wherein $Ar_e$ and $Ar_d$ are independently unsubstituted aryl moieties or aryl moieties with at least one substituent selected from the group consisting of a C-1 to C-8 alkyl, and a moiety comprising a C-5 to C-18 perfluoroalkyl with at least one ether linkage.

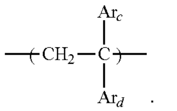

(1c)

Specifically, wherein in the different block copolymers in this second composition, (B) is a second polymer block segment comprising repeat units derived from either an alkyl 2-methylenealkanoate, a lactone; a cyclic carbonate, an oxirane, or an oxetane, wherein the Mw of (B) ranges from about 5,000 g/mol to about 100,000 g/mol; wherein said block copolymer comprising structure (1) has a $M_w$ ranging from about 10,000 g/mol to about 200,000 g/mol and has a polydispersity of 1.00 to about 1.20. Further, in this second composition, at least one said block copolymer is one wherein (A) consists of structure (1a), and at least one block copolymer in said composition is one wherein (A) consist of either structure (1b), or a mixture of structures (1a) and (1b).

In another aspect of this second composition, at least one block copolymer in said composition is one wherein (A) consists of structure (1a), and at least one block copolymer in said composition is one wherein (A) consist of a mixture of structures (1a) and (1b).

In another aspect of this second composition, at least one said block copolymer is one wherein (A) has structure (1a), and at least one said block copolymer is one wherein (A) has structure (1b).

In another aspect of this second composition, at least one said block copolymer is one wherein (A) has structure (1a), and at least one said block copolymer wherein (A) has a mixture of structures (1a) and (1b).

In another aspect of this second composition, it is a mixture of a first and second block copolymer of structure (1), wherein said first block copolymer is one wherein (A) consists of structure (1a), and said second block copolymer in said composition is one wherein (A) consist of either structure (1b), or a mixture of structures (1a) and (1b). In another aspect of this embodiment said first block copolymer is one wherein (A) has structure (1a) and said second block copolymer is one wherein (A) consist of structure (1b). In another aspect of this embodiment said first block copolymer is one wherein (A) has structure (1a) and said second block copolymer is one wherein (A) is a mixture of structure (1a) and (1b).

The present invention relates to forming patterns using the inventive composition in processes comprising directed self-assembly of the novel block copolymer. Any process that comprises the step of directed self-assembly of the novel block copolymer may be used.

The composition comprising the novel block copolymer may be used to form films by applying the inventive composition a substrate by processes such as spin-casting, dip-coating, doctor blading, spraying, or any other known processes. Films of the block copolymer can have a thickness of 1-1000 nm and more particularly 1-130 nm. It is particularly thicknesses film equal or greater than 25 nm in particular in the thickness range of 25 to 125 nm. Films can be optionally annealed to promote self-assembly and remove defects. Annealing processes include thermal annealing, thermal gradient annealing, solvent vapor annealing, thermal solvent vapor annealing and the like. Thermal annealing can be carried out at a temperature above the glass transition temperature of the block copolymer and below the thermal decomposition temperature of the block copolymer. Thermal annealing may be carried out from a temperature of room temperature to about 300° C. Thermal annealing can be performed for a period of about 10 see to about 100 hours, more particularly about 30 seconds to about 1 hour.

The block copolymers of the present invention can form self-assembled domains with various morphologies including lamella, cylinders, and spheres. The size (e.g., width) of these domains may be from about 1 nm to about 100 nm, from about 2 nm to about 30 nm, or more particularly from 3 nm to 20 nm. The present invention further relates to novel processes which employ the novel block copolymer of structure (1). One of the unexpected results imparted by the novel block copolymers of structure (1) is that, when they are coated on a substrate and made to undergo self-assembly, the underlayer does not need to be non-preferential (e.g., neutral). This is due to the larger process latitude (with respect to the underlayer surface affinity) for perpendicular alignment of the novel block copolymer domains imparted by their chi parameter. Another unexpected result, imparted by the novel block copolymers of structure (1), is that they afford block copolymer domains with perpendicular alignment relative to the substrate for much thicker block copolymer films than analogous block copolymers without the novel surface-active junction group. Specifically, ranges from 25 nm to 125 nm are possible.

As a non-limiting example of how this may be used in pattern transfer, when the novel block copolymer is coated on an underlayer (i.e., substrate) and further processed the block copolymer forms microphase-separated domains that comprise cylindrical microdomains oriented perpendicular to the underlayer surface. This is because neither domain has any preference to associate with the underlayer, and which further provide parallel line/space patterns in the block copolymer assembly. The domains, so oriented, are thermally stable under further processing conditions. Thus, after forming a coating layer of the novel block copolymer on an underlayer and causing it to self-assemble by baking and/or annealing, the domains of the block copolymer will form on and remain perpendicular to the underlayer surface.

One of the domains may be selectively removed in the presence of the other domain to generate an etched domain pattern. This selective removal may be accomplished by wet or dry processes. In one example wet or plasma etching could be used with optional UV exposure. Wet etching could be with acetic acid. Standard plasma etch process, such as a plasma comprising oxygen may be used; additionally, argon, carbon monoxide, carbon dioxide, $CF_4$, $CHF_3$, may be present in the plasma. In the case of a thermally decomposable polymer block, the selective removal may be accomplished by a thermal bake. In another example, one of the block copolymer domains may be selectively modified after self-assembly to increase etch resistance. For example, etch resistant metal or inorganic species may be introduced by chemical infiltration from solution or vapor. Domains or functional groups may be selectively reacted with reactive compounds such as silanes or silyl chlorides. Alternatively, cycles of atomic layer deposition (e.g., sequential infiltration synthesis) can be used to infiltrate etch-resistant materials into one domain. After modification, wet or dry etch processes may be used to remove the less resistant domain.

After selective removal process, the resulting etched domain pattern can be further pattern transferred in the substrate layers. These self-assembled block copolymer patterns are transferred into the underlying substrate using known techniques.

In some cases, it may be advantageous to invert the tone of the pattern prior to transfer into the substrate or after transfer into a layer of the substrate. This may be accomplished by standard tone-inversion processes such as backfilling an organic pattern with an etch-resistant spin-on dielectric tone-inversion material.

In the above processes, and the following inventive processes employing the inventive composition comprised of the novel block copolymer of structure (1), other type of substrate may be used. As an example, a substrate which has a coating of high carbon underlayer and a silicon antireflective coating may be used as a substrate. The high carbon underlayer can have coating thickness of about 20 nm to about 2 microns. Over this is coated a silicon antireflective coating of about 10 nm to about 100 nm. In instances where an orientation of the self-assembled cylinder of the novel block copolymer perpendicular to the substrate is desired a neutral layer may be employed.

This invention may be employed also in a variety of other substrates such as those prepared by chemically vapor deposition (CVD), physical vapor deposition (PVD) and atomic layer deposition (ALD). The preparation of substrates using these CVD and PVD is discussed in the following reference: "HANDBOOK OF THIN-FILM DEPOSITION PROCESSES AND TECHNIQUES, Principles, Methods, Equipment and Applications, Second Edition, Edited by Krishna Seshan, Intel Corporation, Santa Clara, California, Copyright © 2002 by Noyes Publications, Library of Congress Catalog Card Number: 2001135178, ISBN: 0-8155-1442-5, Noyes Publications/William Andrew Publishing, 13 Eaton Avenue Norwich, NY 13815, Chapter 1 title: Deposition Technologies and Applications: Introduction and Overview, page 11-page 43, Chapter 1 Authors: Werner Kern and Klaus K. Schuegraf." The preparation of substrates by ALD is described in the following reference: "Chemical Review 2010, 110, page 111-131."

In another embodiment of this invention, the inventive compositions described herein comprising at least one block copolymer having structure (1) are employed in a method for vertically orienting first and second block copolymer domains over an unpatterned substrate using a layer of a block copolymer having a periodicity of $L_0$ comprising steps a) and b), as follows:

a) Forming a coating layer of a block copolymer from the inventive composition on said unpatterned substrate; and b) Annealing the layer of the block copolymer to generate a non-zero positive integer number of first and second block copolymer domains, vertically oriented on said unpatterned substrate.

In the inventive method comprising steps a) and b), the unpatterned substrate may be selected from the group consisting of a polymer brush layer (e.g. brush random copolymer of styrene and methyl methacrylate), a cross-linked polymer layer, a self-assembled monolayer, a layer of anti-reflection coating, a layer deposited by chemically vapor deposition (CVD), a layer of carbon, a layer deposited by physical vapor deposition (PVD), a layer deposited by atomic layer deposition (ALD).

In one aspect of the inventive method comprising steps a) and b), said unpatterned substrate is one which is an unpatterned conventional neutral layer.

In another embodiment of this invention, the inventive compositions described herein comprised of at least one block copolymer having structure (1) are employed in a method of vertically orienting first and second block copolymer domains over a first patterned substrate where the height of topography of the pattern on the substrate is at least 0.7 times $L_0$ and aligning the domains with the pattern, using a coating comprised of a block copolymer having a periodicity of $L_0$ comprising steps a1) and b1); as follows:

a1) Forming a coating layer of the block copolymer with a junction group with the composition of the aforementioned inventive composition comprised of the block copolymer having structure (1) on said first topographical substrate wherein the average thickness of the coating layer of the block copolymer is less than the height of the topography of the first topographical substrate, wherein the block copolymer layer is laterally confined by the topography; and, b1) Annealing the block copolymer layer to generate first and second block copolymer domains, which are vertically oriented on said first patterned substrate, and confined within the recessed region.

In the method comprising steps a1) and b1), the first patterned substrate is a topography-forming material over an underlayer where the topography-forming material may be selected from the group consisting of resist materials, a cross-linked polymer layer, a layer of anti-reflection coating, a layer deposited by chemical vapor deposition (CVD), a layer deposited by physical vapor deposition (PVD), a layer deposited by atomic layer deposition (ALD), and further where the underlayer is selected from the group consisting of a polymer brush layer (e.g. brush random copolymer of styrene and methyl methacrylate), a cross-linked polymer layer, a self-assembled monolayer, a layer of anti-reflection coating, a layer deposited by chemical vapor deposition (CVD), a layer deposited by physical vapor deposition (PVD), a layer deposited by atomic layer deposition (ALD). Furthermore, in this embodiment of the invention where the first patterned substrate is a resist material, it may be selected from the group consisting of i-line photoresists, g-line photoresists 284 nm photoresists, 193 nm photoresist, Extreme Ultraviolet photoresists, and electron beam photoresists. Another embodiment is where the first patterned substrate is an antireflective coating material and is selected from the group consisting of bottom antireflective coatings, silicon antireflective coatings, and titanium antireflective coatings.

In one aspect of the method comprising steps a1) and b1), said first patterned substrate is one which has at the bottom of said recessed region a layer of a conventional neutral layer.

In another embodiment of this invention, the inventive compositions described herein comprised of at least one block copolymer having structure (1) are employed in a method of vertically orienting, first and second block copolymer domains with a periodicity of $L_0$ over a second patterned substrate having a topographical pattern of which the height of topography is larger than 0.7 times $L_0$ and a pitch $P_1$ where the pitch $P_1$ is a non-zero positive integer multiplied by $L_0$, and aligning the domains with the pattern, using the novel coating comprised of a block copolymer comprising steps a2) and b2), as follows:

a2) Forming a coating layer from block copolymer with a surface-active junction group with aforementioned the composition of the inventive composition comprised of the block copolymer having structure (1) on said second patterned substrate, where the thickness of the coating layer of the block copolymer is more than the height of the topography of the second patterned substrate; and, b2) Annealing the block copolymer layer to generate a non-zero positive integer number of first and second block copolymer domains vertically oriented on said second patterned substrate and aligning them to the second patterned substrate where the sum of vertically oriented domains is equal or larger than the pitch $P_1$ the of topographical pattern.

In the embodiment of the inventive process comprising steps a2) and b2), the first patterned substrate is prepared by treating topographical organic features on top of inorganic layer with plasma which selectively trims the organic features and modifies the exposed surface region of the inorganic layer. In a further embodiment of this embodiment the material of topographical organic features is selected from the group consisting of patterned i-line photoresists, g-line photoresists 248 nm photoresists, 193 nm photoresist, Extreme Ultraviolet photoresists, and electron beam photoresists over a thin underlayer. In a final embodiment of this embodiment the underlayer may be an antireflective coating, or an inorganic layer material is selected from silicon antireflective coatings, or titanium antireflective coatings.

In one aspect of the method comprising steps a2) and b2) said second patterned substrate is one which has at the bottom of said recessed region a layer of a conventional neutral layer.

In another embodiment of this invention, the inventive composition comprised of at least one block copolymer having structure (1) is employed in a method of vertically orienting first and second block copolymer domains over a substrate having a surface chemical prepattern having a pitch $P_2$, where the pitch $P_2$ is a non-zero positive integer multiplied by $L_0$ and aligning the domains with the prepattern, using a coating comprised of a block copolymer where the block copolymer has a periodicity of $L_0$ comprising steps a3) and b3), as follows:

a3) Forming a coating layer of the block copolymer with a surface-active junction group with the inventive composition containing the block copolymer of structure (1) on the substrate having a surface chemical prepattern, b3) Annealing the block copolymer layer to generate vertically oriented first and second block copolymer domains aligned with the substrate having a surface chemical prepattern having a pitch $P_2$.

In another embodiment of the method comprised of step a3) and b3), the substrate having a surface chemical prepattern is comprised of alternating preferential wetting regions and orientation control regions where the sum of the width of preferential wetting regions and the width of the orientation control region is equal to the prepattern pitch $P_2$, where the materials used in the orientation control region supports vertical orientation of the block copolymer domains, and the preferential wetting region has a lower interfacial energy to one of the block copolymer domain compared to the other block copolymer domain.

In another aspect of the method comprising steps a2) and b2), said surface chemical prepattern having a pitch P2 is one in which one of the elements having pitch P2 is a region of conventional neutral layer.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Synthesis of Block Copolymers and Relevant Materials

Instruments and Chemicals

All other chemicals, unless otherwise indicated, were obtained from the Millipore/Sigma Chemical Company (Millipore/Sigma Corp St. Louis, MO, USA) and used as received.

Unless otherwise indicated spinning and baking of films was done with Laurel WS-650-23B spin coater and a Tokyo Electron Ltd. Clean Track ACT-8. Nordson (300 Nordson Dr. M/S 47 Amherst, OH 44001 U.S.A. MARCH etcher was used for plasma etching of non-Si containing domain. Top down and cross section images were respectively taken on an AMAT (Applied Materials, Inc. 3050 Bowers Avenue P.O. Box 58039 Santa Clara, CA 95054-3299 U.S.A.) Nano-SEM 3D and a Hitachi (Hitachi High Technologies America Inc. 10 North Martingale Road, Suite 500 Schaumburg, Illinois 60173-2295) S-5500.

Synthesis of 1,1'-diphenylethylene-$C_8$FE

3-Benzoylbenzyl bromide (9.9 g, 35.6 mmol), C8FE-OH (20.8 g, 43.2 mmol) and KOH (2.42 g, 43.2 mmol) in 40 mL of DMF were stirred at RT for overnight. Salt was filtered off by washing ethyl acetate and most solvent was evaporated. Silica column chromatography purification was done by Hex/EA=20:1. and 17.6 g (73% isolated yield) was obtained as yellowish oil (Scheme 1). nBuLi (1.6 M, 18.5 mL, 29.5 mmol) was added through cannula into triphenylphosphonium methylbromide (10.4 g, 29.1 mmol) in THF at 0° C. and this mixture was stirred about 1 hour until solid powder disappeared. At ice bath, C8FE-benzophenone (17.6 g, 26.0 mmol) in THF was added to reaction solution and stirred for 2 hrs at room temperature. The reaction mixture was quenched with diluted HCl aqueous solution and washed with water using ethyl acetate as an organic solvent. After evaporating solvents and it was dried with $MgSO_4$. Silica column chromatography was carried out with Hex/$CHCl_3$=40/1. 16.2 g of colorless oil was isolated as 92.5% yield (Scheme 2).

Scheme 1

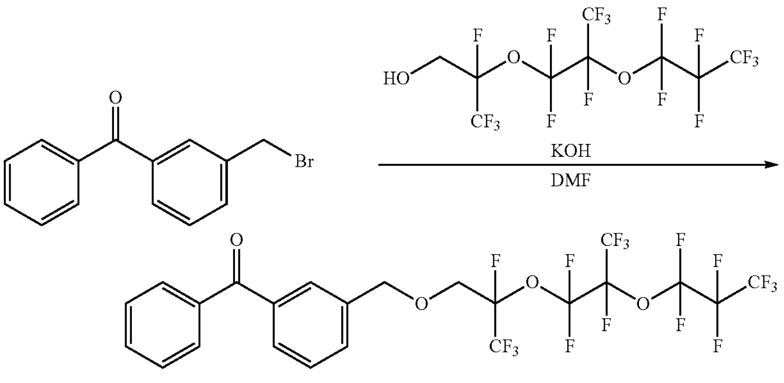

Scheme 2

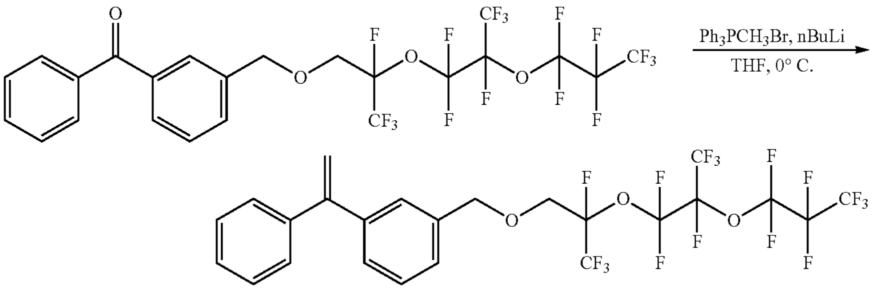

BCP Example 1

Synthesis of (PS-b-P(S-Alt-DPE))-DPE-b-PMMA Block Copolymers

Styrene and methyl methacrylate and 1,1'-diphenylethylene (DPE) monomers were distilled in the presence of dehydrating agents into calibrated ampules and stored under $N_2$. Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 700 mL dry tetrahydrofuran. The temperature of the reactor was reduced to −78° C. using dry ice-acetone bath. Then, after titrating the impurities, 0.71 mL (1.4 M solution) of sec-butyllithium was added into the reactor. Then 18 g (0.173 moles) of styrene was added from ampule into the reactor under fast stirring. The reaction solution turned into yellow-orange and the reaction was stirred over 30 minutes. Subsequently, a mixer of 1.80 g (0.00998 moles) of 1,1'-diphenylethylene (DPE) and 0.91 g (0.00874 moles) of styrene was added via ampule into the reactor. The orange color of the reaction mixture turned into dark brick-red indicating conversion of styryl lithium active centers to styrene-Alt-DPE adduct carbanion. The dry ice-acetone bath was then removed, and the reaction mixture was stirred at RT for 3 hours. A small amount (2 mL) of the reaction mixture was withdrawn for PS-b-P(S-Alt-DPE) block molecular weight analysis. The temperature of the reactor was reduced to −78° C. using dry ice-acetone bath. Then methyl methacrylate (21.78 g, 0.218 moles) was added via ampule. The reaction was terminated after 30 min with 1 mL of degassed methanol. The block copolymer was recovered by precipitation in excess isopropanol (5 times of the polymer solution) containing 10% water, filtered, and dried at 70° C. for 12 h under vacuum giving 40 g of PS-b-P(S-Alt-DPE)-DPE-b-PMMA) (94% yield). Gel permeation chromatography equipped with 100 Å, 500 Å, $10^3$ Å, $10^5$ Å and $10^6$ Å μ-ultrastyragel columns showed that the 1st PS-b-P(S-Alt-DPE) block had $M_1$ (GPC)=22,000 g/mol and $M_w/M_1$=1.10 with respect to PS calibration standards. The diblock copolymer molecular weight obtained from GPC is $M_n$PS-b-P(S-Alt-DPE)-DPE-b-PMMA=40,000 g/mol and $M_w/M_n$=1.10.

BCP Examples 2-6

These PS-b-P(S-Alt-DPE)-DPE-b-PMMA block copolymers were synthesized using same procedure as Example 1 with different DPE mol % for target $L_0$.

BCP Example 7: Synthesis of P((S-Alt-DPE)(S-co-DPE))-DPE-b-PMMA Block Copolymers Styrene and methyl methacrylate and 1,1'-diphenylethylene (DPE) monomers were distilled in the presence of dehydrating agents into calibrated ampules and stored under $N_2$. Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 700 mL dry tetrahydrofuran. The temperature of the reactor was reduced to −78° C. using dry ice-acetone bath. Then, after titrating the impurities, 1 mL (1.4 M solution) of sec-butyllithium was added into the reactor. Then a mixture of 17.63 g (0.169 moles) of styrene and 3.46 g (0.0192 moles) of 1,1'-diphenylethylene (DPE) was added from ampule into the reactor under fast stirring. The reaction solution mixture turned into dark brick-red indicating conversion of styryllithium active centers to styrene-Alt-DPE adduct carbanion. The dry ice-acetone bath was then removed, and the reaction mixture was stirred at RT for 4 hours. A small amount (2 mL) of the reaction mixture was withdrawn for P(S-Alt-DPE)(S-co-DPE)-molecular weight analysis. The temperature of the reactor was then reduced to −78° C. using dry ice-acetone bath. Then methyl methacrylate (23.6 g, 0.0.238 moles) was added via ampule. The reaction was terminated after 30 min with 1 mL of degassed methanol. The block copolymer was recovered by precipitation in excess isopropanol (5 times of the polymer solution) containing 10% water, filtered, and dried at 70° C. for 12 h under vacuum giving 42 g of P(S-Alt-DPE))(S-co-DPE)-DPE-b-PMMA) (94% yield). Gel permeation chromatography equipped with 100 Å, 500 Å, $10^3$ Å, $10^5$ Å and $10^6$ Å μ-ultrastyragel columns showed that the 1st P((S-Alt-DPE)(S-co-DPE))-block had $M_n$(GPC) =16,160 g/mol and $M_w/M_n$=1.14 with respect to PS calibration standards. The diblock copolymer molecular weight obtained from GPC is $M_n$P(S-Alt-DPE)(S-DPE)-DPE-b-PMMA=36,250 g/mol and $M_w/M_n$=1.2.

BCP Example 8-9

These P((S-Alt-DPE)(S-co-DPE))-DPE-b-PMMA were synthesized using same procedure with different DPE mol % for target $L_0$.

BCP Example 10 Synthesis of P((S-Alt-DPE)(S-co-DPE))-DPE(C8FE)-b-PMMA with Perfluoroether Tag at the Junction of Block Copolymers Styrene and methyl methacrylate and 1,1'-diphenylethylene (DPE) monomers were distilled in the presence of dehydrating agents into calibrated ampules and stored under $N_2$. Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 700 mL dry tetrahydrofuran. The temperature of the reactor was reduced to −78° C. using dry ice-acetone bath. Then, after titrating the impurities, 0.84 mL (1.4 M solution) of sec-butyllithium was added into the reactor. Then a mixture of 10 g (0.151 moles) of styrene and 10 g (0.0.055 moles) of 1,1'-diphenylethylene (DPE) was added from ampule into the reactor under fast stirring. The reaction solution mixture turned into dark brick-red indicating conversion of styryllithium active centers to styrene-Alt-DPE adduct carbanion. The dry ice-acetone bath was then removed, and the reaction mixture was stirred at RT for 7 hours. A small amount (2 mL) of the reaction mixture was withdrawn for P((S-Alt-DPE)(S-co-DPE)) block molecular weight analysis. The temperature of the reactor was then reduced to −78° C. using dry ice-acetone bath. Then 0.45 g (0.0015 moles) 1,1'-diphenylethylene-$C_8$FE in 2.5 ml of dry toluene was added via ampule into the reactor. After 2 minutes methyl methacrylate (23.6 g, 0.0.238 moles) was added via ampule. The reaction was terminated after 30 min with 1 mL of degassed methanol. The block copolymer was recovered by precipitation in excess isopropanol (5 times of the polymer solution) containing 10% water, filtered, and dried at 70° C. for 12 h under vacuum giving 41 g of P((S-Alt-DPE)(S-co-DPE))-DPE (C8FE)-b-PMMA) (94% yield). Gel permeation chromatography equipped with 100 Å, 500 Å, $10^3$ Å, $10^5$ Å and $10^6$ Å μ-ultrastyragel columns showed that the 1st P((S-Alt-DPE)(S-co-DPE)) block had $M_n$ (GPC)=20,000 g/mol and $M_w/M_n$=1.12 with respect to PS calibration standards. The diblock copolymer molecular weight obtained from GPC is $M_n$P((S-Alt-DPE)(S-co-DPE))-DPE(C8FE)-b-PMMA=38,450 g/mol and $M_w/M_n$=1.2.

BCP Example 11 Synthesis of P((S-Alt-DPE)(S-co-DPE))-DPE(C8FE)-b-PLA with Perfluoroether Tag at the Junction of Block Copolymers Synthesis of Masked Macroinitiator In a dried Schlenk flask, THF (74 mL) was added and cooled to −78° C. for titration with sBuLi. The mixture was warmed to RT. Distilled 1,1-diphenylethylene, DPE (5.59 g, 0.03 mole) was weighed in a flask. Styrene (6.27 g, 0.06 mole) was degassed and distilled over CaH into the DPE-containing flask. The mixture was degassed using freeze-thaw technique. Tetrahydropyranyl-glycidol (2.82 g, 0.02 mole) was diluted with toluene (3 mL), freeze-thawed, then titrated with sBuLi. About 10% of the S-DPE mixture was transferred to the Schlenk flask by cannula and cooled to 0° C. The mixture was initiated with sBuLi (2.12 mL, 1.4 M in cyclohexane) and stirred for 5 minutes. The remaining S-DPE mixture was added slowly, stirred for 15 minutes, then warmed to room temperature and stirred for 1 hour. The titrated THP-glycidol was added by cannula, followed by addition of methylene chloride (37 mL). Perfluoro-3,6,9-trioxadecanoic acid chloride (5.11 g, 0.01 mole) was added along with triethylamine (1.65 g, 0.01 mole) and dimethylaminopyridine (0.18 g, 1.5 mmole) and the mixture was stirred overnight. The mixture was precipitated into IPA to isolate the THP-protected macroinitiator (13.5 g, 99.2%). GPC analyses: 4,048 g/mol Mn, 4,784 g/mol Mw, 1.18 PDI.

Synthesis of Macroinitiator

The THP protected macroinitiator (13.5 g, 2.82 mmole) was dissolved in MeOH (13.5 mL), then para-toluenesulfonic acid (1.61 g, 8.47 mmole) was added and the mixture stirred overnight at room temperature. The mixture was precipitated twice in isopropanol. The polymer was collected, and vacuum dried overnight at 70° C. as a white solid (10.44 g, 79.0%). GPC analyses: 4,351 g/mol Mn, 4,953 g/mol $M_w$, 1.14 PDI.

Synthesis of Diblock Copolymer

The macroinitiator (2 g, 0.04 mmol), lactide (1.68 g, 0.01 mole), and indium (III) chloride (0.09 g, 0.04 mmole) were added into a Schlenk flask and warmed under vacuum for 2 hours. Dichloromethane (16 mL) was added and the mixture stirred until completely dissolved. Triethylamine (0.11 mL, 0.08 mmole) was added to initiate the polymerization. The mixture was stirred overnight at room temperature. Acetyl chloride (0.11 g, 1.4 mmole) and triethylamine (0.14 g, 1.4 mmole) were added to cap the end hydroxyl group. The mixture was stirred for 1 hour, then precipitated into isopropanol. The solid was collected and dried in a vacuum oven. The polymer was redissolved in THF, then reverse precipitated with cyclohexane. Once the unreacted P((S-Alt-DPE)(S-co-DPE)) block was fractionated off, the polymer was redissolved in THF and precipitated into IPA. The polymer was dried in a vacuum oven as a white powder (2.05 g, 65.4%). GPC analyses: 13,832 g/mol Mn, 15,074 g/mol $M_w$, 1.09 PDI.

Comparative Example 1 Synthesis of PS-b-PMMA Block Copolymers

P(S-b-MMA) (21K-b-24K) was synthesized using the same procedure as described in previous examples. Briefly, 20 g (0.192 moles) of styrene was polymerized with 0.68 mL (1.4 M solution) of sec-butyllithium. Then 0.196 g (0.0011 moles) of 1,1'-diphenylethylene (DPE) in 2.5 mL of dry toluene was added via ampule into the reactor. The orange color of the reaction mixture turned into dark brick-red indicating conversion of styryllithium active centers to delocalized DPE adduct carbanion. After 2 min of stirring, a small amount (2 mL) of the reaction mixture was withdrawn for PS block molecular weight analysis. Then methyl methacrylate (22.85 g, 0.23 moles) was added via ampule. The reaction was terminated after 30 min with 1 mL of degassed methanol. The block copolymer was recovered by precipitation in excess isopropanol (5 times of the polymer solution) containing 10% water, filtered, and dried at 70° C. for 12 h under vacuum giving 40 g of P(S-b-MMA) (94% yield).

Gel permeation chromatography equipped with 100 Å, 500 Å, 10' A, $10^5$ Å and $10^6$ Å μ-ultrastyragel columns showed that the $1^{st}$ PS block had $M_n$ (GPC)=21,000 g/mol and $M_w/M_n$=1.02 with respect to PS calibration standards. The diblock copolymer molecular weight obtained from GPC is $M_{n,PS\text{-}b\text{-}PMMA}$=43,000 g/mol and $M_w/M_n$=1.02.

Neutral Underlayer Synthesis Example 1 Synthesis of P(S-co-PMMA) Brush Neutral Layer Polymer A 2000-ml flask equipped with a condenser, temperature controller, heating mantle and mechanical stirrer were set up. 400 grams (3.84 moles) of styrene(S), 401 grams (4 moles) of methyl methacrylate (MMA), 9.44 grams (0.016 moles) of nitroxide initiator and 534 grams of Anisole were added to the flask. The mechanical stirrer was turned on and set up at about 120 rpm. The reaction solution was then degassed by vigorously bubbling nitrogen through the solution for about 30 minutes at room temperature. After 30 minutes of degassing the heating mantle was turned on and the temperature controller was set at 140° C., and the stirred reaction mixture was maintained at this temperature for 20 hours. After this time the heating mantle was turned off and the reaction solution was allowed to cool down to about 40° C. Then the reaction mixture was poured into 13 L of isopropanol stirred with a mechanical stirring during the addition. During this addition, the polymer was precipitated out. The precipitated polymer was collected by filtration. The collected polymer was dried in vacuum oven at 40° C. About 500 grams of the polymer was obtained. This dried polymer was dissolved in 1500 grams of THF and then filtered through a 0.2 um nylon filter. The filtered solution was then precipitated again into a stirred solution of 13 L methanol, the precipitated polymer collected and dried as before under vacuum at 40° C. In this manner, 400 grams (48% yields) of the polymer was obtained after dry. The polymer had an $M_w$ of about 15 k and a polydispersity (PDI) of 1.5.

Synthesis of PMMA-OH Brush Layer

In a 100 mL Schlenk flask, AIBN (0.03 g, 0.12 mmole), 4-cyano-4-[(dodecylsulfanylthiocarbonyl)sulfanyl]pentanol (0.45 g, 1.15 mmole) methyl methacrylate (21.65 g, 216 mmole) and methyl isobutyl ketone (11 mL) were added and degassed by freeze-thaw three times. The mixture was stirred at 450 RPM and heated to 80° C. for 5 h. The mixture was cooled, diluted with THF and precipitated into 10% isopropanol/hexanes (600 mL). The solid was collected by vacuum filtration and dried in the vacuum oven at 50° C. for overnight. The product was isolated as a pale-yellow solid (19.4 g, 97.3% yield).

End-Group Reduction:

In a 250 mL 3-neck flask with a reflux condenser under nitrogen, 19.4 g of the RAFT-polymer was dissolved in methyl ethyl ketone (58 g), triethylammonium hypophosphite (1.33 g, 7.94 mmole), AIBN (0.15 g, 0.92 mmole) were added and heated to reflux for 3 h. The mixture was cooled to room temperature, than precipitated into 10% isopropanol/hexanes (600 mL). The polymer was collected by vacuum filtration, dried, then redissolved in THF and precipitated once again in hexanes. The polymer was collected by vacuum filtration and dried in a vacuum oven overnight (16.7 g, 87.5%). GPC: 17,301 g/mole Mn, 19,827 g/mole $M_w$; 1.15 PDI.

General Procedure for Self-Assembly of Novel BCP's and Comparative BCP on P(S-co-PMMA-OH) or Brush Neutral Layers (Neutral Underlayer Synthesis Example 1 or Synthesis of PMMA-OH) Preparation of P(S-co-MMA) or PMMA-OH Brush Solutions A solution was made in PGMEA with 0.3 wt % which was filtered through a 0.02 um PTFE filter.

Substrate Preparation:

A silicon wafer was coated with Neutral Underlayer Synthesis Example 1 or 2 (0.3 wt % in PGMEA) at 1500 rpm and the wafers were subsequently each baked at 250° C. for 30 min/N2. Then rinse with PGMEA for 2 minutes, spin dried for 30 seconds, soft bake at 110° C. for 1 min.

Preparation of BCP Formulation:

Coating of BCP: Coated the BCP at 1500 rpm and the wafers were subsequently each soft baked at 110° C. for 1 min then annealed at 250° C. under $N_2$ for 30 min. All BCP's formulations were made in PGMEA with 1.25 wt % which was filtered through a 0.02 um PTFE filter.

Etching of Polymer Samples

Etching of the polymer sample was done with a much etcher under the following conditions: 15 sec $O_2/N_2$ etch. FIGS. 1-6 show the formation of Fingerprint Pattern (FP) self-assembly of our novel tunable high-chi block copolymer comprising P(S-Alt-DPE) copolymer segments and PMMA as polar block segments. When the orientation was parallel on the P(S-co-MMA) brush neutral layer due to either the placement of S-Alt-DPE segment at the beginning or the higher concentration of DPE in the non-polar polystyrene block, these novel tunable high-chi BCP were blended with PS-b-PMMA and achieved the formation of perpendicular assembly on the P(S-co-MMA) brush neutral layer (FIG. 6).

FIG. 1: (a), (b) and (c) show, respectively, the fingerprint pattern (FP) self-assembly observed of PS-b-P(S-Alt-DPE)-b-PMMA with 10, 20 and 30 mol % of DPE on the P(S-co-MMA) brush neutral layer.

Figure 2:
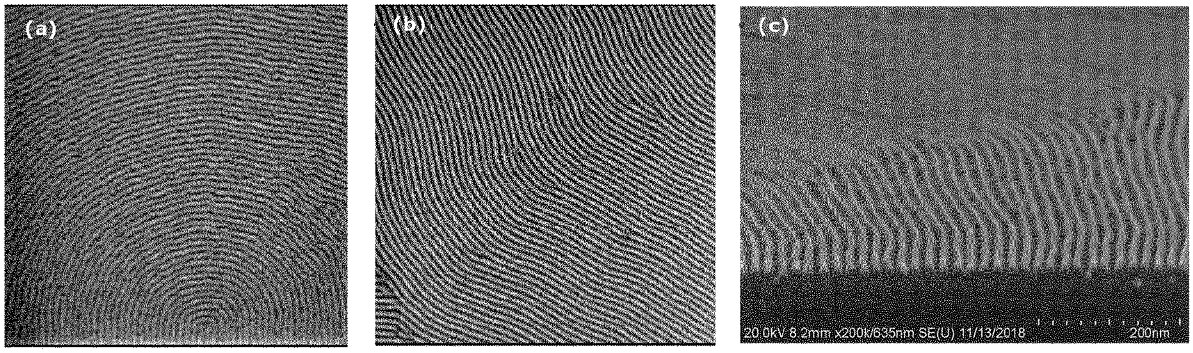
FIG. 2: Collapsed free sub 20 nm $L_0$ FP with PS-b-P(S-Alt-DPE)-b-PMMA. 1FOV SEM images of PS-b-P(S-Alt-DPE)-b-PMMA with 20 mol % DPE, $L_0$=19 nm. Process conditions: Solution of Neutral Underlayer Synthesis Example 1: 230° C./4 hours (N2); EBR 2 min, spin dry, 110° C./1 min, FT=30 nm. (a) FP before etching, (b) after 15 sec $O_2/N_2$ etch and (c) cross-section SEM image after etching.

FIG. 2: (a), (b) and (c) show respectively collapses free self-assembled sub 20 nm $L_0$ FP with PS-b-P(S-Alt-DPE)-b-PMMA on the P(S-co-MMA) neutral brush layer which were observed from top down SEM before etching (a), top down SEM after 15 sec $O_2/N_2$ etch (b), and cross section SEM after this etch.

Figure 3:
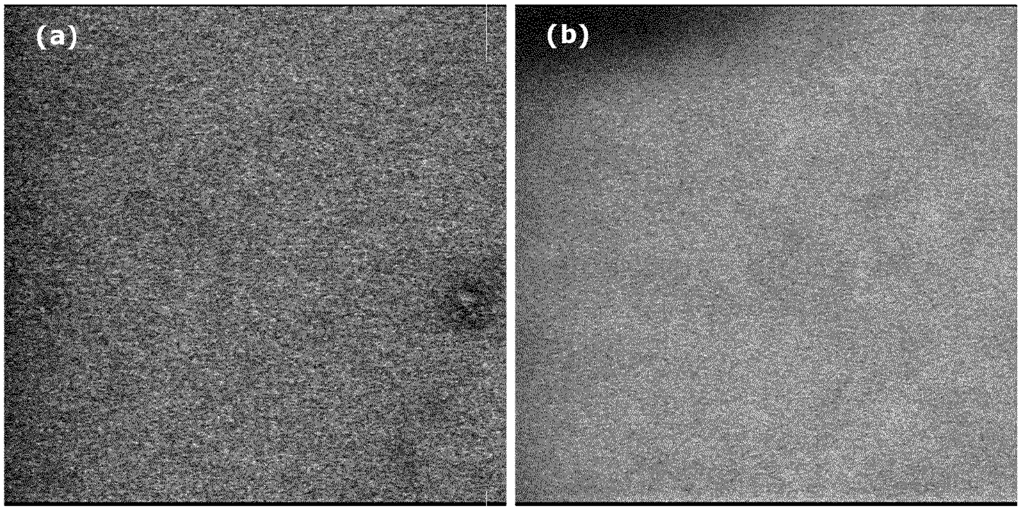
FIG. 3: FP orientation differences of perpendicular vs parallel depending on the sequence distribution of SDPE in the PS-b-P(S-Alt-DPE)-b-PMMA vs P((S-Alt-DPE)(S-co-DPE))-DPE-b-PMMA with 10% and 30% DPE composition in the block copolymer segment on styrene and MMA copolymer brush underlayer (PGME solution of Neutral Underlayer Synthesis Example 1) 1FOV SEM images, Process conditions: PGMEA solution of Neutral Underlayer Synthesis Example 1: 230° C./4 hours (N2); EBR 2 min, spin dry, 110° C./1 min, FT=30 nm. (a) DPE 10 mol %, (b) DPE 30 mol % shows parallel assembly, No FP observed.

FIG. 3 shows the different extent of formation of perpendicular self-assembly versus parallel self-assembly observed on the P(S-co-MMA) (Neutral Underlayer Synthesis Example 1) neutral brush layer depending on the sequence distribution of SDPE in the P(S-Alt-DPE)-b-PMMA with 10% and 30% DPE. Specifically it compares the self-assembly of a coating of PS-b-P(S-Alt-DPE)-b-PMMA (10 DPE) (BCP Example 3) which shows perpendicular L/S self-assembly vs a coating of P((S-Alt-DPE)(S-co-DPE))-b-PMMA (10 and 30 mole % DPE)(BCP Example 7 and 8). which shows L/S parallel self-assembly with no Fingerprint self-assembly.

Figure 4:
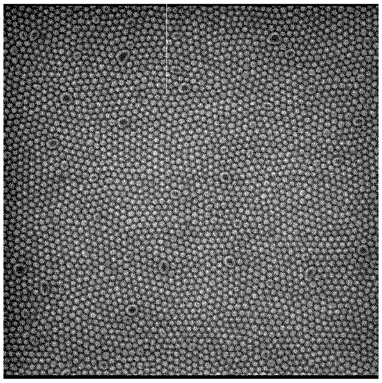
FIG. 4: SEM study showing that P(S-Alt-DPE)(S-co-DPE))-DPE-b-S)-b-PMMA which shows no orientation as such can be oriented with perfluoroether tag at the junction of P((S-Alt-DPE)-DPE(C8FE)-b-PMMA 2FOV SEM images, Process conditions: PGMEA solution of Neutral Underlayer Synthesis Example 1: 250° C./30 min (N2); EBR 2 min, spin dry, 110° C./1 min, FT=30 nm. (a) DPE 37 mol % shows PS post assembly: dry, 110° C./1 min, FT=30 nm. (a) DPE 34 mol % shows 17 nm $L_0$.

FIG. 4 shows that P((S-Alt-DPE-)(S-co-DPE))-DPE (C8FE)-b-PMMA (BCP example #10) coated on the P(S-co-MMA) brush neutral layer (Neutral Underlayer Synthesis Example 1) shows self-assembly into posts. This in contrast to the analogous polymer P((S-Alt-DPE)(S-co-DPE))-DPE-b-PMMA (BPC example #9) which also has 37 mole % DPE, but has no fluororether pendant group at its DEP junction and does not show any self-assembly.

Figure 5:
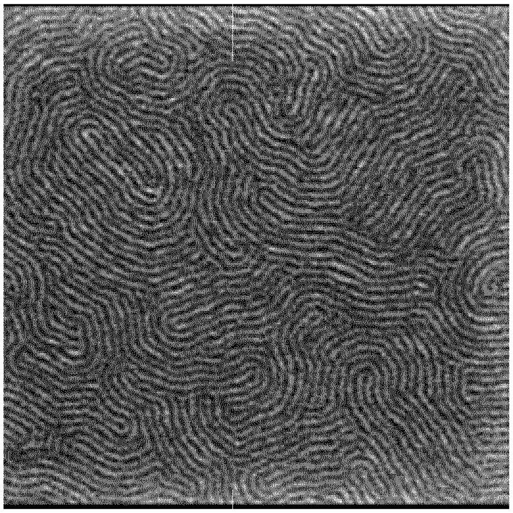
FIG. 5: FP of P((S-Alt-DPE)(S-co-DPE)-DPE(C8FE)-b-PLA 1FOV SEM images, Process conditions: PGMEA solution of PMMA-OH: 170° C./5 min (air); EBR 2 min, spin dry, 110° C./1 min, FT=30 nm. (a) DPE 34 mol % shows 17 nm $L_0$.
Figure 6:
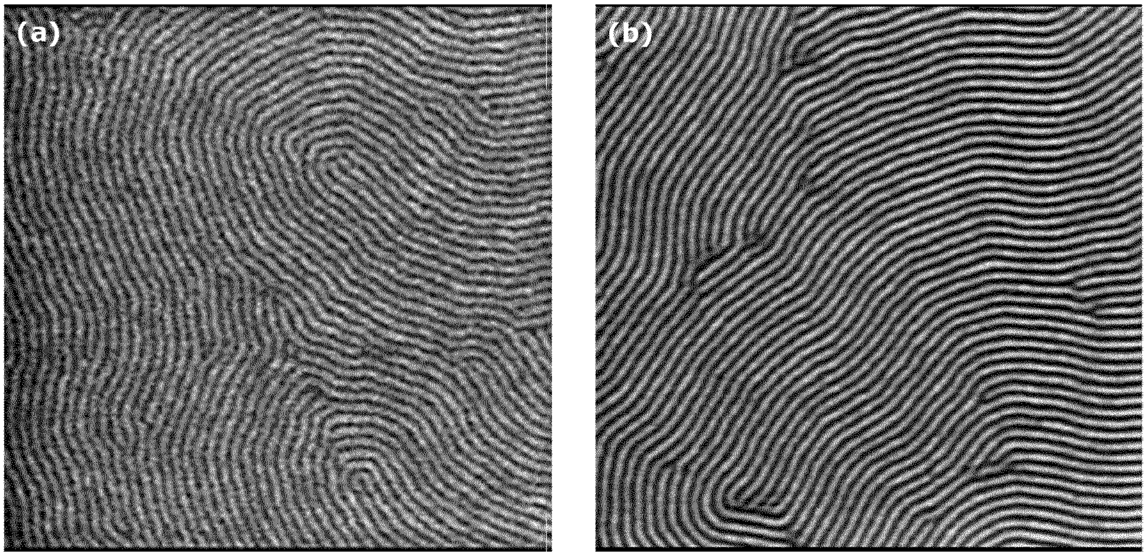
FIG. 6: SEM study which shows P((S-Alt-DPE)-b-PMMA which does not show FP as such could be blended with regular PS-b-PMMA to achieve 20 nm $L_0$ 1FOV SEM images, Process conditions: PGMEA solution of Neutral Underlayer Synthesis Example 1: 250° C./30 min (N2); EBR 2 min, spin dry, 110° C./1 min, FT=30 nm. (a) $L_0$=20.7 from a blend of example 9 P((S-Alt-DPE)(S-co-DPE))-DPE-b-PMMA with PS-b-PMMA at 50:50 wt %. (b) after 20 sec 02 etch shows no line collapsed.

FIG. 5: shows FP self-assembly of P((S-Alt-DPE)(S-co-DPE))-DPE(C8FE)-b-PLA (BPC Example #11) on a coating of PMMA-OH (Polymer from Example Synthesis of PMMA-OH dissolved in PGMEA)

FIG. 6: Shows P((S-Alt-DPE)(S-co-DPE))-b-PMMA which does not show FP self-assembly, as such, could be blended with regular PS-b-PMMA to achieve 20 nm $L_0$. Specifically, this was a 50:50 wt %. blend of BCP example 9P((S-Alt-DPE)(S-co-DPE)-DPE-b-PMMA with BCP Example 12 (PS-b-PMMA at 50:50 wt %. Even after a 20 sec 02 plasma etch to remove the PMMA etchable block copolymer segment, these FP self-assembled lines o did not show any line collapse.

Figure 7:
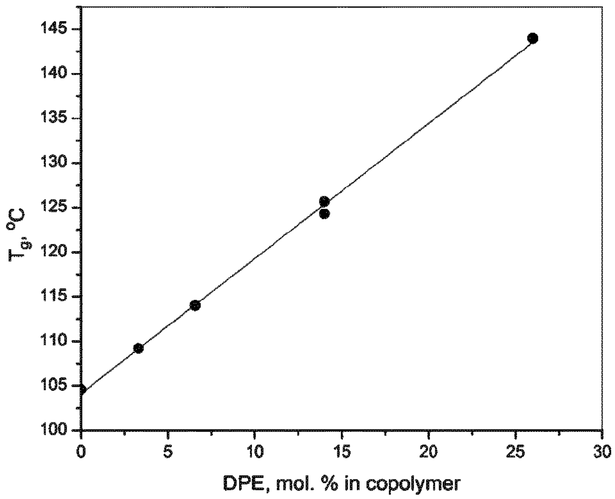
FIG. 7: Graph showing the advantages of the PS-Alt-DPE copolymer segment in the novel block copolymers showing the change of $T_g$ for the new PS-Alt-DPE copolymer segment depending of the composition of 1,1-diphenylethylene (DPE).
Figure 8:
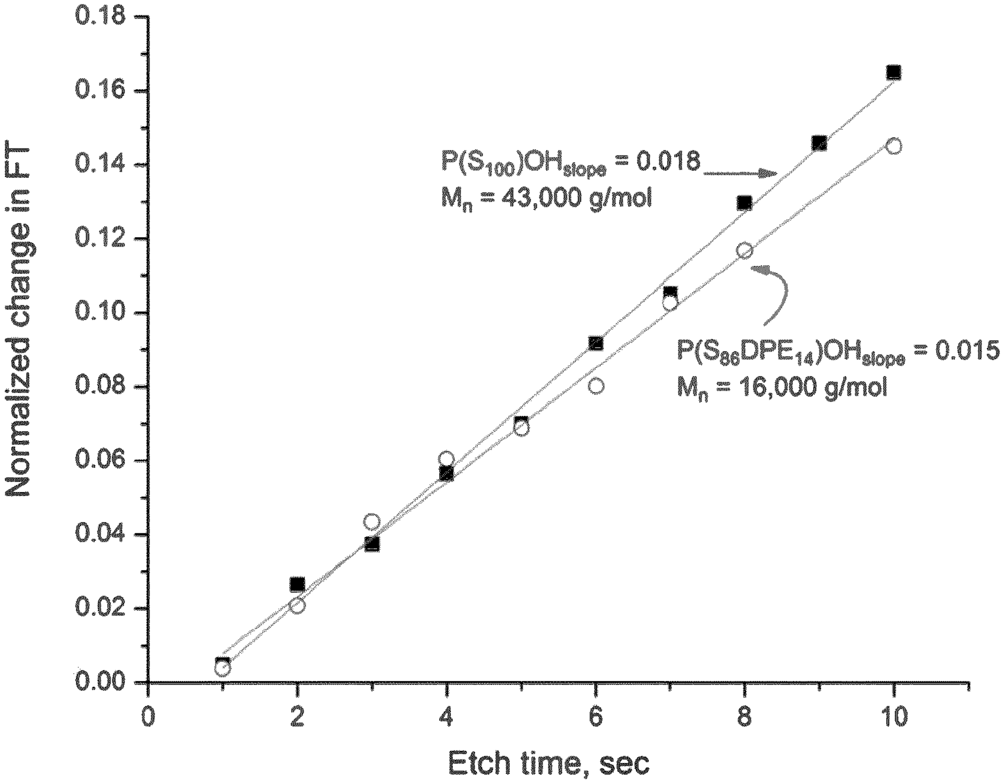
FIG. 8: Graph Enhanced etch resistance of new PS-Alt-DPE copolymer segment showing ~16% higher resistivity for oxygen plasma, measured on a film (36 nm thickness) over silicon substrate.

The inventive tunable high-chi block copolymers have PS-Alt-DPE copolymer segment which are unique and the placement of DPE units can be controlled to improve etch selectivity and pattern collapse through increase both the Etch resistance and the glass transition of these novel polymers. The advantage of the PS-Alt-DPE copolymer segment is that it provides 1) tunable chi parameter for the diblock copolymer, and tunable etch resistivity via compositional control of both 1,1-diphenylethylene and styrene repeat units. (FIG. 7-8). Specifically, FIG. 7 shows the increase of $T_g$ for the novel with increasing DPE content which is favorable towards preventing line collapse during plasma etching. FIG. 8 shows the Etch rate comparison for the Plasma 02 etching rate of a film of PS—OH and $P(S_{86}DPE_{14})$-OH, which showed that if you have DPE in PS block then etch resistance increased. Specifically, a PS $1^{st}$ blocks in PS-b-PMMA versus a first P(SDPE) in P(S-co-DPE)-b-PMMA Example 7, 8 and 9 did not form FP on NLD-127 (PS-PMMA under layer) with DPE loading from 10-40 mol %. However, these polymers could form FP when blending with either a), b) or c) as follows:

a) PS-b-PMMA (example-12)

b) Blending with any of Example 3 or Example 5.

c) Blending with Example 10 or 11.

TABLE 1

PS-b-P(S-Alt-DPE)-b-PMMA and P(S-Alt-DPE)-b-PMMA systhesis and charaterization data

| Sample ID | $M_n$ (non polar block) | $M_n$ BCP's | Chemical Structure | PDI ($M_w/M_n$) | DPE mol % | $L_0$ |
|---|---|---|---|---|---|---|
| BCP Ex 1 | 13.9K | 28.2K[a] | P(S-b-P(S-Alt-DPE))-DPE-b-PMMA | 1.12 | 5.5 | 21 nm |
| BCP Ex 2 | 20.8K | 36.7K[a] | P(S-b-P(S-Alt-DPE))-DPE-b-PMMA | 1.11 | 5.5 | 29 nm |
| BCP Ex 3 | 14.9K | 34.6K[a] | P(S-b-P(S-Alt-DPE))-DPE-b-PMMA | 1.03 | 10 | 21.9 nm |
| BCP Ex 4 | 11.9 | 29.8K[a] | P(S-b-P(S-Alt-DPE))-DPE-b-PMMA | 1.02 | 15 | 20.1 nm |
| BCP Ex 4a | 11.4K | 26.9K[a] | P(S-b-P(S-Alt-DPE))-DPE-b-PMMA | 1.02 | 20 | 18.8 nm |
| BCP Ex 5 | 11.5K | 31.8K[a] | P(S-b-P(S-Alt-DPE))-DPE-b-PMMA | 1.03 | 30 | 21.27 nm |
| BCP Ex 6 | 10K | 24K[a] | P(S-b-P(S-Alt-DPE))-DPE-b-PMMA | 1.14 | 50 | Parallel/ No FP |
| BCP Ex 7 | 16K | 35.7K[b] | P((S-Alt-DPE)(S-co-DPE))-DPE--b-PMMA | 1.2 | 10 | Parallel/ No FP |
| BCP Ex 8 | 12.6K | 28.0K[b] | P((S-Alt-DPE)(S-co-DPE))-DPE--b-PMMA | 1.2 | 30 | Parallel/ No FP |
| BCP Ex 9 | 6.9K | 14.2K[b] | P((S-Alt-DPE)(S-co-DPE))-DPE--b-PMMA | 1.14 | 37 | Parallel/ No FP |
| BCP Ex 10 | 20.4K | 41.5K[c] | P((S-Alt-DPE)(S-co-DPE))-DPE(C8FE)-b-PMMA, | 1.12 | 37 | PS post assembly |
| BCP Ex 11 | 6.8K | 19.3K[d] | P((S-Alt-DPE)(S-co-DPE))-DPE(C8FE)-b-PLA | 1.09 | 34 | 17 nm |
| BCP Ex 12 | 21.0K | 41.9K[e] | [e)] PS-b-PMMA | 1.02 | 0 | 23 nm |

Mn and PDI were measured by GPC

What is claimed is:

1. A block copolymer comprising structure (1)

(A)-(C)-(B) (1);

wherein (A) is a first polymer block segment comprising a copolymer block segment selected from structure (1a), structure (1b), and a mixture of structures (1a) and (1b), wherein Ar, $Ar_a$, $Ar_b$ and $Ar_e$ are each independently selected from the group consisting of unsubstituted aryl moieties or aryl moieties with at least one substituent selected from the group consisting of a C-1 to C-8 alkyl, and moieties comprising a C-5 to C-18 perfluoroalkyl with at least one ether linkage, x, x1, x2 and x3 and x4 are independently the number of repeat units;

wherein the structures (1a1), (1a2) and (1a3), which are present in structure (1a), structure (1b) or a mixture of structures (1a) and (1b), are present in amounts such that the mole % of structure (1a1) ranges from about 3 mole % to about 40 mole %, as measured against to sum of structures (1a1), (1a2) and (1a3); and, wherein the $M_w$ of (A) ranges from about 5,000 to about 100,000 g/mole, (1a)

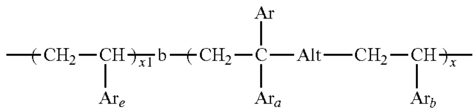

, (1b)

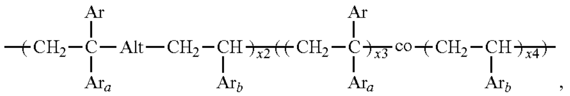

, (1a1)

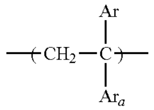

(1a2)

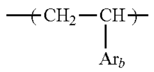

(1a3)

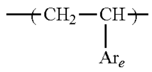

;

wherein (C) is a spacer moiety comprising structure (1c), wherein $Ar_c$ and $Ar_d$ are independently unsubstituted aryl moieties or aryl moieties with at least one substituent selected from the group consisting of a C-1 to C-8 alkyl, and a moiety comprising a C-5 to C-18 perfluoroalkyl with at least one ether linkage, (1c)

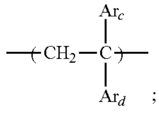

;

wherein (B) is a second polymer block segment comprising repeat units derived from either an alkyl 2-methylenealkanoate (alkyl-O—(C═O)—C(alkyl)═$CH_2$), a lactone, a cyclic carbonate, an oxirane, or an oxetane, wherein the Mw of (B) ranges from about 5,000 g/mol to about 100,000 g/mol; and said block copolymer comprising structure (1) has a $M_w$ ranging from about 10,000 g/mol to about 200,000 g/mol and has a polydispersity of 1.00 to about 1.20.

2. The block copolymer of claim 1, which has a polydispersity ranging from 1.00 to about 1.12.

3. The block copolymer of claim 1, wherein (A) comprises a block copolymer segment of structure (1a).

4. The block copolymer of claim 1, wherein (A) comprises a diblock copolymer segment of structure (1b).

5. The block copolymer of claim 1, wherein (A) comprises a mixture of diblock copolymer segment of structures (1a) and (1b).

6. The block copolymer of claim 1, wherein (A) consists of structure (1a).

7. The block copolymer of claim 1, wherein (A) consists of structure (1b).

8. The block copolymer of claim 1, wherein (A) consists of a mixture of structure (1a) and (1b).

9. The block copolymer of claim 1, wherein (C) consists of structure (1c).

10. The block copolymer of claim 1, wherein (C) comprises structure (1c1) wherein Rs is selected from the group consisting of an unsubstituted C-1 to C-3 alkylene moiety and C-1 to C-3 alkylene moieties substituted with at least one substituent selected from the group consisting of a C-1 to C-8 alkyl, and a moieties comprising a C-5 to C-18 perfluoroalkyl with at least one ether linkage, $Ar_c$, and $Ar_d$ are independently unsubstituted aryl moieties or aryl moieties with at least one substituent independently selected from the group consisting of a C-1 to C-8 alkyl, and a moiety comprising a C-5 to C-18 perfluoroalkyl with at least one ether linkage;

(1c1)

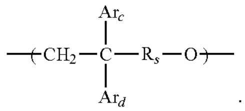

.

11. The block copolymer of claim 1, wherein (B) is a polymer block segment whose repeat units are derived from an alkyl 2-methylenealkanoate.

12. The block copolymer of claim 1, wherein (B) is a polymer block segment whose repeat units are derived from an alkyl methacrylate.

13. The block copolymer of claim 1, wherein (B) is a polymer block segment whose repeat units are derived from a lactone.

14. The block copolymer of claim 1, wherein (B) is a polymer block segment whose repeat units are derived from a cyclic carbonate.

15. The block copolymer of claim 1, wherein (B) is a polymer block segment whose repeat units are derived from an oxirane.

16. The block copolymer of claim 1, wherein (B) is a polymer block segment whose repeat units are derived from an oxetane.

17. The block copolymer of claim 1, which has structure (2), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_6$ is a C-1 to C-4 alkyl, and x1, x, and y are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(2)

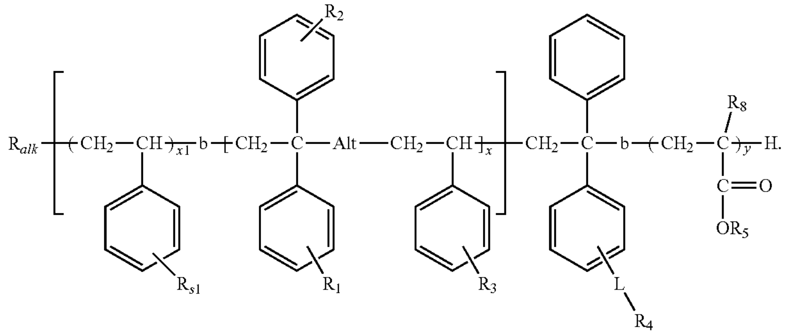

18. The polymer of claim 1, which has structure (3), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_6$ is a C-1 to C-4 alkyl, x2, x3, x4 and y are independently the number of the respective repeat units, and L is a linking group selected from the group consisting of a direct valence bond, a C-1 to C-4 alkylene spacer, a C-1 to C-4 alkylene-oxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy);

(3)

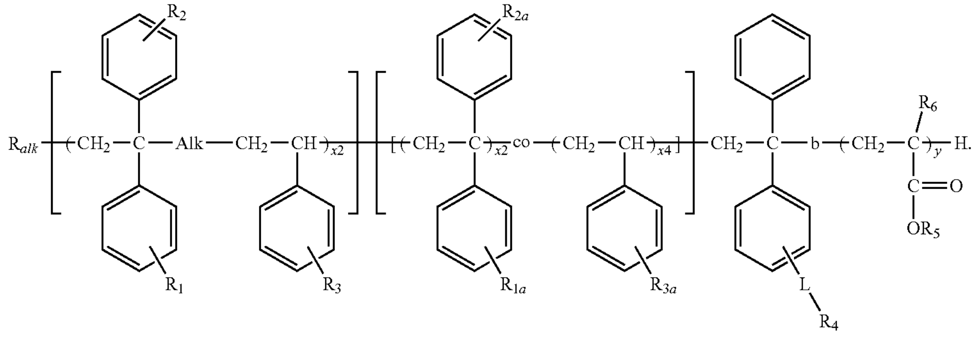

19. The polymer of claim 1, which has structure (4), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_5$ is a C-1 to C-8 alkyl, $R_6$ is a C-1 to C-4 alkyl, x, x1, x2, x3, x4 and y are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(4)

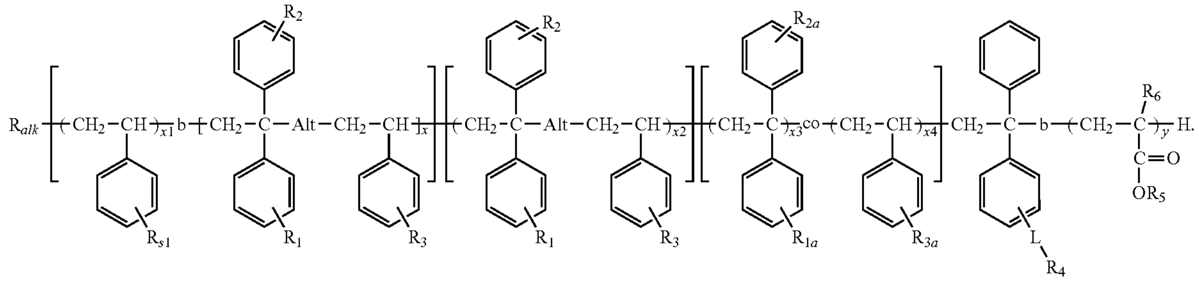

20. The block polymer of claim 1, which has structure (5), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ is an unsubstituted C-1 to C-4 alkylene or a C-1 to C-4 alkylene moiety substituted with at least one C-1 to C-8 alkyl, $R_{cap}$ is a C-1 to C-8 alkyl, and x1, x, and y 1 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(5)

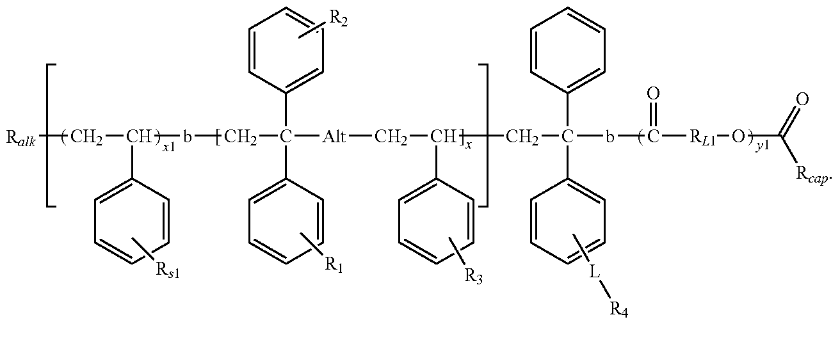

21. The block polymer of claim 1 which has structure (6), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ is an unsubstituted C-1 to C-4 alkylene or a C-1 to C-4 alkylene moiety substituted with at least one C-1 to C-8 alkyl, $R_{cap}$ is a C-1 to C-8 alkyl, x2, x3, x4, and y1 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy);

(6)

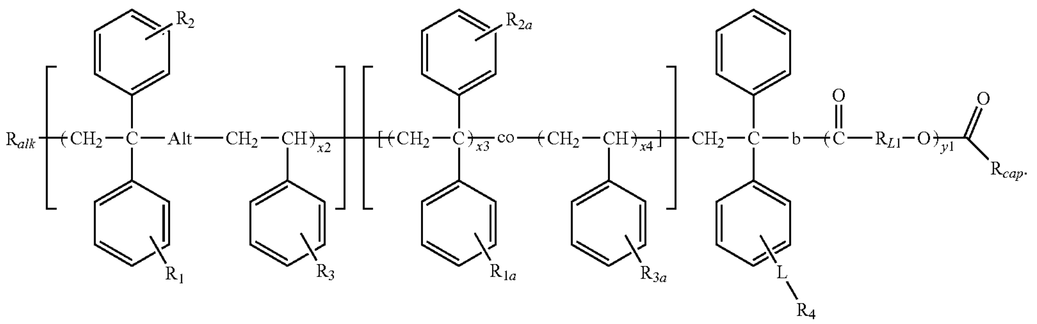

22. The block polymer of claim 1, which has structure (7), wherein $R_{alk}$ is a C-1 to C-8 alkyl, $R_1$, $R_{1a}$, $R_2$, $R_{2a}$, $R_3$, and $R_{3a}$, are independently selected from the group consisting of H, and a C-1 to C-8 alkyl, $R_4$ is selected from the group consisting of H, a C-1 to C-8 alkyl, and moieties comprising a C-5 to C-18 perfluoroalkyl with at least one ether linkage, $R_{L1}$ is an unsubstituted C-1 to C-4 alkylene or a C-1 to C-4 alkylene moiety substituted with at least one C-1 to C-4 alkyl, x1, x, x2, x3, x4 and y1 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(=O)-alkylene) moiety and a C-2 to C-4 alkyleneoxyalkylene spacer (-alkylene-oxy-alkylene);

(7)

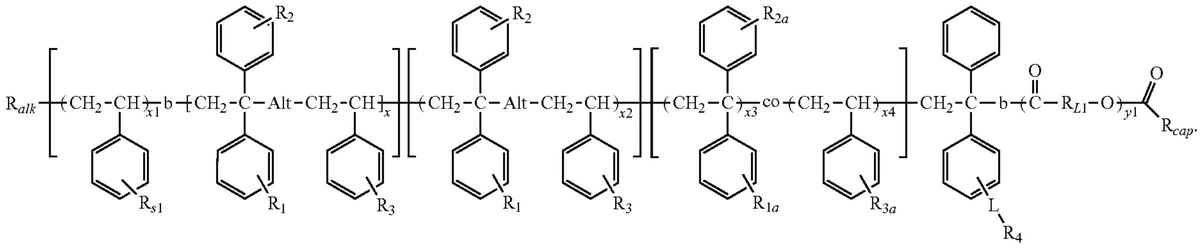

23. The block polymer of claim 1 which has structure (8), wherein $R_{alk}$ is a C-1 to C-8 alkyl, $R_{s1}$, $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ and $R_{l2}$ are independently an unsubstituted C-1 to C-4 alkylene or a C-1 to C-4 alkylene moiety substituted with at least one C-1 to C-4 alkyl, $R_{cap}$ is a C-1 to C-8 alkyl, and x1, x, and y1 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy).

(8)

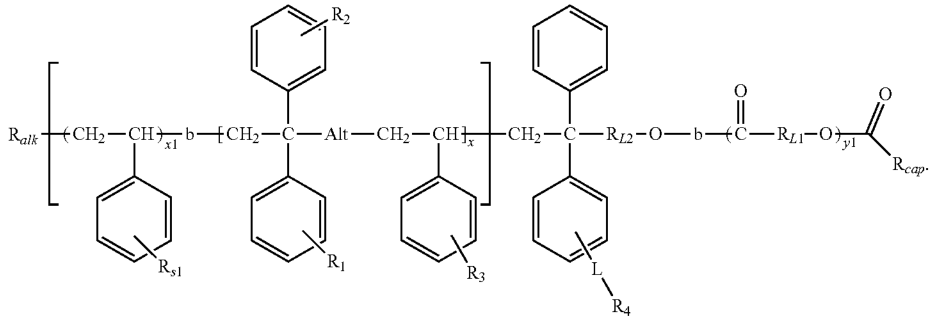

24. The block polymer of claim 1, which has structure (9), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{L1}$ and $R_{L2}$ are independently an unsubstituted C-1 to C-4 alkylene or a C-1 to C-4 alkylene moiety substituted with at least one C-1 to C-4 alkyl, $R_{cap}$ is a C-1 to C-8 alkyl, and x, x1, x2, and y1 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(9)

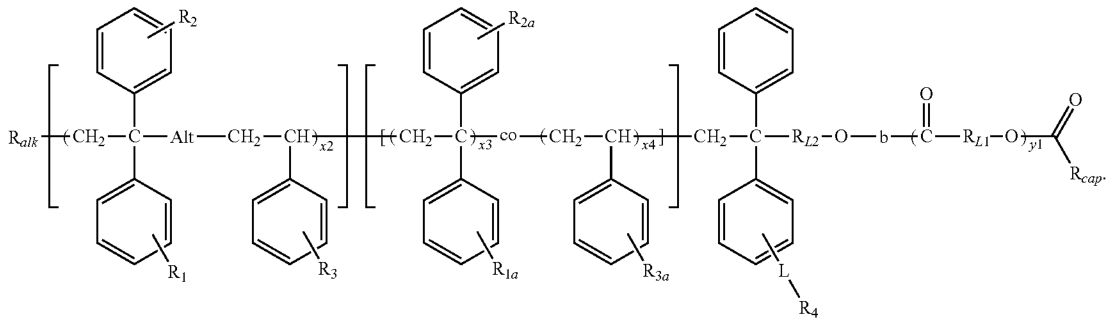

25. The block polymer of claim 1, which has structure (10), wherein $R_{alk}$ is a C-1 to C-8 alkyl, $R_{s1}$, $R_1$, $R_{1a}$, $R_2$, $R_{2a}$, $R_3$, and $R_{3a}$, are independently selected from H, and a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L1}$ and $R_{L2}$ are independently an unsubstituted C-1 to C-4 alkylene or a C-1 to C-4 alkylene moiety substituted with at least one C-1 to C-4 alkyl, x1, x, x2, x3, x4 and y1 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(=O)-alkylene) moiety and a C-2 to C-4 alkyleneoxyalkylene spacer (-alkylene-oxy-alkylene);

(10)

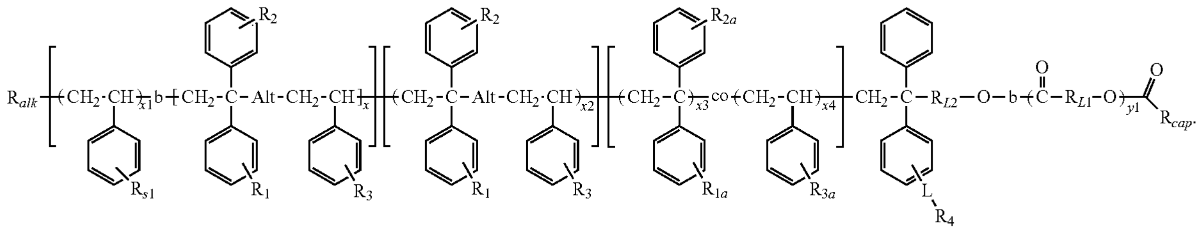

26. The block copolymer of claim 1, which has structure (11), wherein $R_{alk}$ is a C-1 to C-8 alkyl, $R_{s1}$, $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L3}$ is an unsubstituted C-2 to C-3 linear alkylene or a C-2 to C-3 linear alkylene moiety substituted with at least one C-1 to C-4 alkyl, $R_{cap1}$ is a C-1 to C-8 alkyl or a C-2 to C-8 carbonylalkyl, and x1, x, and y2 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy);

(11)

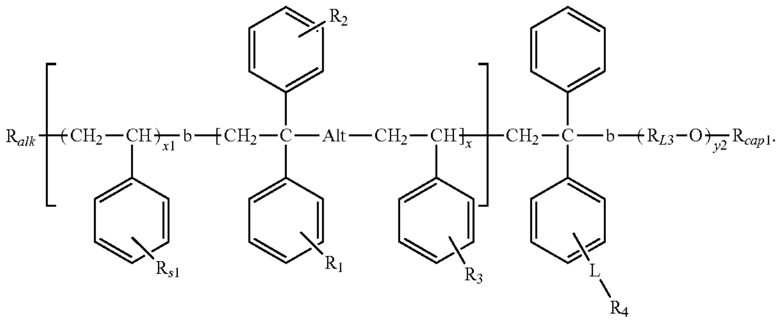

27. The block copolymer of claim 1, which has structure (12), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{L3}$ is an unsubstituted C-2 to C-3 linear alkylene or a C-2 to C-3 linear alkylene moiety substituted with at least one C-1 to C-4 alkyl, $R_{cap1}$ is a C-1 to C-8 alkyl or a C-2 to C-8 carbonylalkyl, and x, x1, x2, and y2 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(12)

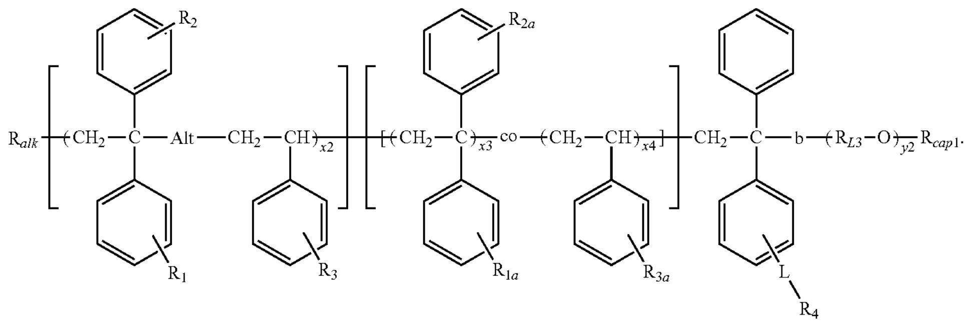

28. The block copolymer of claim 1 which has structure (13), wherein $R_{alk}$ is a C-1 to C-8 alkyl, $R_{s1}$, $R_1$, $R_{1a}$, $R_2$, $R_{2a}$, $R_3$, and $R_{3a}$, are independently selected from the group consisting of H, and a C-1 to C-8 alkyl, $R_4$ is selected from the group consisting of H, a C-1 to C-8 alkyl, and moieties comprising a C-5 to C-18 perfluoroalkyl with at least one ether linkage, $R_{L3}$ is an unsubstituted C-2 to C-3 linear alkylene or a C-2 to C-3 linear alkylene moiety substituted with at least one C-1 to C-4 alkyl, $R_{cap1}$ is a C-1 to C-8 alkyl or a C-2 to C-8 carbonylalkyl, x1, x, x2, x3, x4 and y2 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(═O)-alkylene) moiety and a C-2 to C-4 alkyleneoxyalkylene spacer (-alkylene-oxy-alkylene);

(13)

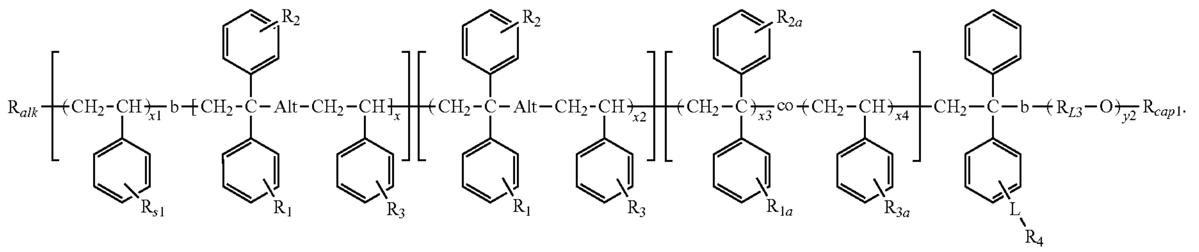

29. The block copolymer of claim 1, which has structure (14), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L4}$ is an unsubstituted C-2 to C-3 linear alkylene or a C-2 to C-3 linear alkylene moiety substituted with at least one C-1 to C-4 alkyl, $R_{cap2}$ is a C-1 to C-8 alkyl, $R_{cap1}$ is a C-1 to C-8 alkyl or a C-2 to C-8 carbonylalkyl, x1, x, and y3 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy);

(14)

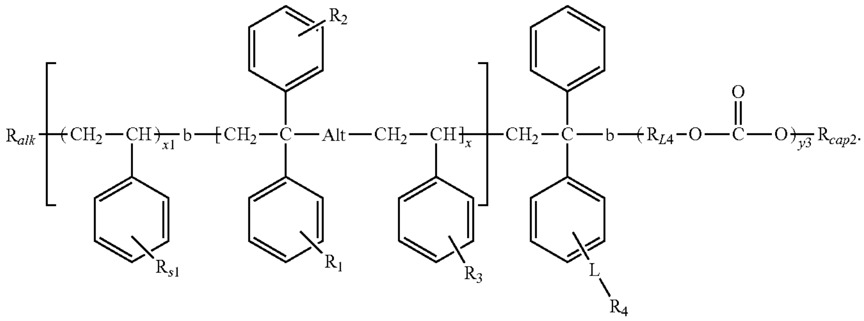

30. The block copolymer of claim 1 which has structure (15), wherein $R_{alk}$ is a C-1 to C-8 alkyl, $R_1$, Ria, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{L4}$ is a C-2 to C-4 alkylene or a C-1 to C-4 alkylene moiety substituted with at least one C-1 to C-4 alkyl, $R_{cap2}$ is a C-1 to C-8 alkyl or a C-2 to C-8 carbonylalkyl, x2, x3, x4 and y3 are independently the number of the respective repeat units, and L is a linking group selected from the group consisting of a direct valence bond, a C-1 to C-4 alkylene spacer, a C-1 to C-4 alkyleneoxycarbonyl-alkylene (alkylene-oxy-C(=O)-alkylene) moiety, a C-2 to C-4 alkyleneoxyalkylene spacer (-alkylene-oxy-alkylene), and a C-1 to C-4 (alkylene-oxy);

(15)

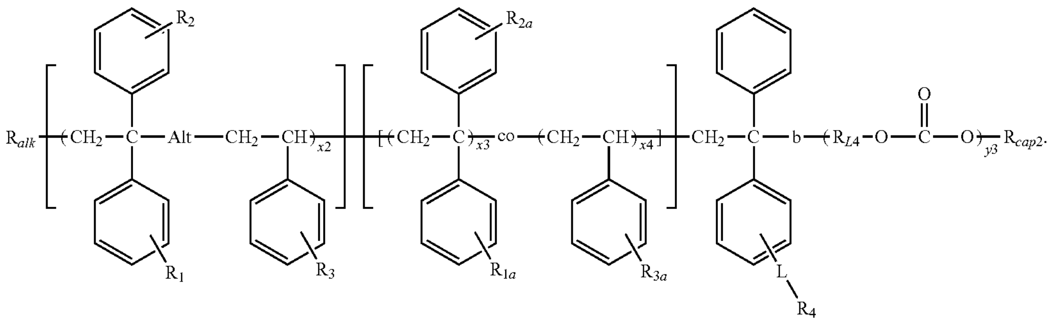

31. The block copolymer of claim 1 which has structure (16), wherein $R_{alk}$ is a C-1 to C-8 alkyl, $R_{s1}$, $R_1$, $R_{1a}$, $R_2$, $R_{2a}$, $R_3$, and $R_{3a}$, are independently selected from the group consisting of H, and a C-1 to C-8 alkyl, $R_4$ is selected from the group consisting of H, a C-1 to C-8 alkyl, and a moiety comprising a C-5 to C-18 perfluoroalkyl with at least one ether linkage, $R_{L4}$ is an unsubstituted C-2 to C-4 alkylene or a C-2 to C-4 alkylene moiety substituted with at least one C-1 to C-4 alkyl, $R_{cap2}$ is a C-1 to C-8 alkyl or a C-2 to C-8 carbonylalkyl, x1, x, x2, x3, x4 and y3 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(═O)-alkylene) moiety and a C-2 to C-4 alkyleneoxyalkylene spacer (-alkylene-oxy-alkylene);

(16)

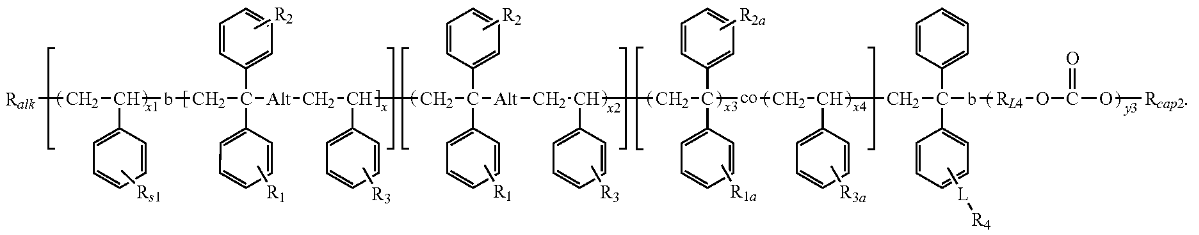

32. The block copolymer of claim 1, which has structure (17), wherein $R_{alk}$ is a C-1 to C-8 alkyl, $R_{s1}$ $R_1$, $R_2$, and $R_3$, are independently selected from H or a C-1 to C-8 alkyl, $R_4$ is selected from the group consisting of H, a C-1 to C-8 alkyl, and a moiety comprising a C-5 to C-18 perfluoroalkyl with at least one ether linkage, $R_{l2}$ and $R_{L4}$ are independently an unsubstituted C-1 to C-4 alkylene or a C-1 to C-4 alkylene moiety substituted with at least one C-1 to C-4 alkyl, $R_{cap2}$ is a C-1 to C-8 alkyl or a C-2 to C-8 carbonyl-alkyl, x1, x, and y3 are independently the number of the respective repeat unit, L is a linking group selected from the group consisting of a direct valence bond, a C-1 to C-4 alkylene spacer, a C-1 to C-4 alkyleneoxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(17)

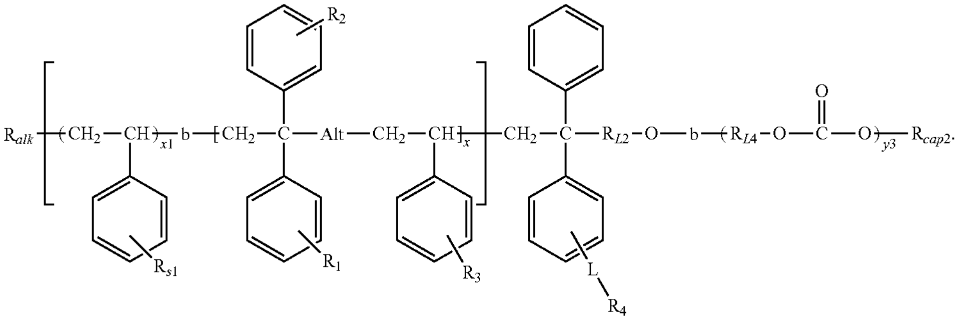

33. The block copolymer of claim 1, which has structure (18), wherein $R_{alk}$ is a C-1 to C-8 alkyl, $R_1$, $R_{1a}$, $R_2$, $R_{2a}$, $R_3$, and $R_{3a}$, are independently selected from H or a C-1 to C-8 alkyl, $R_4$ is a C-5 to C-18 perfluoroalkyl pendant group comprising at least one ether linkage, $R_{l2}$ and $R_{L4}$ are independently an unsubstituted C-1 to C-4 alkylene or a C-1 to C-4 alkylene moiety substituted with at least one C-1 to C-4 alkyl, $R_{cap2}$ is a C-1 to C-8 alkyl or a C-2 to C-8 carbonylalkyl, x2, x3, x4 and y3 are independently the number of the respective repeat units, and L is a linking group selected from the group consisting of a direct valence bond, a C-1 to C-4 alkylene spacer, a C-1 to C-4 alkylene-oxycarbonyl-alkylene (alkylene-oxy-C(═O)-alkylene) moiety, a C-2 to C-4 alkyleneoxyalkylene spacer (-alkylene-oxy-alkylene), and a C-1 to C-4 (alkylene-oxy);

(18)

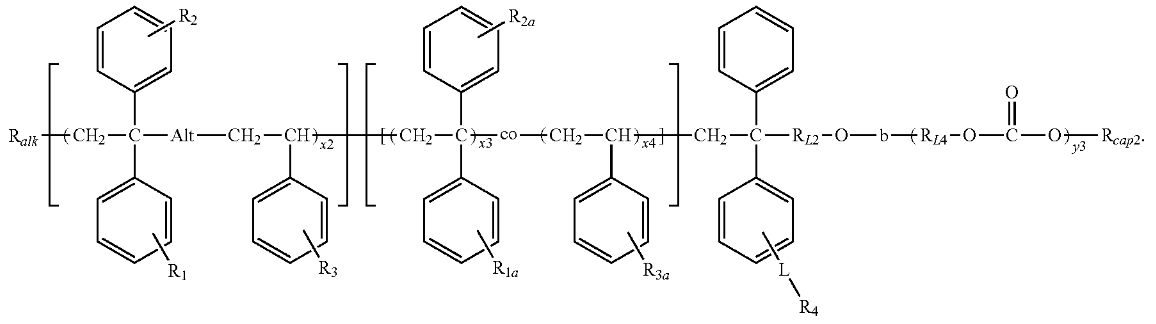

34. The block copolymer of claim 1, which has structure (19), wherein $R_{alk}$ is a C-1 to C-8 alkyl, $R_1$, $R_{1a}$, $R_2$, $R_{2a}$, $R_3$, and $R_{3a}$, are independently selected from the group consisting of H, and a C-1 to C-8 alkyl, $R_{l2}$ and $R_{L4}$ are independently an unsubstituted C-1 to C-4 alkylene or a C-1 to C-4 alkylene moiety substituted with at least one C-1 to C-4 alkyl, $R_4$ is selected from the group consisting of H, a C-1 to C-8 alkyl, and a moiety comprising a C-5 to C-18 perfluoroalkyl with at least one ether linkage, $R_{L4}$ is an unsubstituted C-2 to C-4 alkylene or a C-2 to C-4 alkylene moiety substituted with at least one C-1 to C-4 alkyl, $R_{cap2}$ is a C-1 to C-8 alkyl or a C-2 to C-8 carbonylalkyl, x1, x, x2, x3, x4 and y3 are independently the number of the respective repeat unit, and L is a linking group selected from the group consisting of a direct valence bond, a C-1 to C-8 alkylene spacer, a C-1 to C-4 alkyleneoxycarbonyl-alkylene (alkylene-oxy-C(═O)-alkylene) moiety and a C-2 to C-4 alkyleneoxyalkylene spacer (-alkylene-oxy-alkylene);

(19)

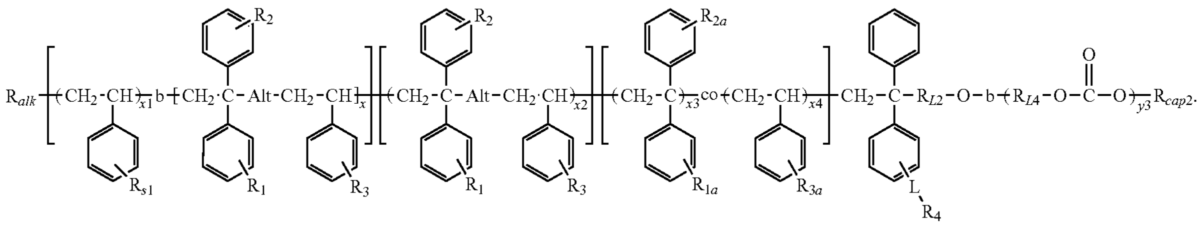

35. A composition comprising at least one block copolymer of claim 1 and a solvent.

36. A method of vertically orienting first and second block copolymer domains over an unpatterned substrate using a layer of a block copolymer composition having a periodicity of $L_0$ comprising the steps of:

a) forming a coating layer of a block copolymer from the composition of claim 35 on said unpatterned substrate; and, b) annealing the layer of the block copolymer to generate a non-zero positive integer number of first and second block copolymer domains, vertically oriented on said unpatterned substrate.

37. A method of vertically orienting first and second block copolymer domains over a first patterned substrate where the height of topography of the pattern on the substrate is at least 0.7 times $L_0$ and aligning the domains with the pattern, using a coating comprised of a block copolymer having a periodicity of $L_0$ comprising the steps of:

a1) forming a coating layer of the composition of claim 35 on said first topographical substrate, wherein the average thickness of the coating layer of the block copolymer is less than the height of the topography of the first topographical substrate, wherein the block copolymer layer is laterally confined by the topography; and, b1) annealing the block copolymer layer to generate first and second block copolymer domains, vertically oriented on said first patterned substrate, and confined within the recessed region.

38. A method of vertically orienting, first and second block copolymer domains with a periodicity of $L_0$ over a second patterned substrate having a topographical pattern with the height of topography larger than 0.7 times $L_0$ and a pitch P1 where the pitch P1 is a non-zero positive integer multiplied by $L_0$, and aligning the domains with the pattern comprising the steps of:

a2) forming a coating layer of a block copolymer with the composition of claim 35 on said second patterned substrate, where the thickness of the coating layer of the block copolymer is more than the height of the topography of the second patterned substrate; and, b2) annealing the block copolymer layer to generate a non-zero positive integer number of first and second block copolymer domains vertically oriented on said second patterned substrate and aligning them to the second patterned substrate where the sum of vertically oriented domains is equal or larger than the pitch P1 the of topographical pattern.

39. A method of vertically orienting first and second block copolymer domains over a substrate having a surface chemical prepattern having a pitch P2, where the pitch P2 is a non-zero positive integer multiplied by $L_0$ and aligning the domains comprising the steps of:

a3) forming a coating layer of the composition of claim 35 on the substrate having a surface chemical prepattern; and, b3) annealing the block copolymer layer to generate vertically oriented first and second block copolymer domains aligned with the substrate having a surface chemical prepattern having a pitch P2.

* * * * *